(12) United States Patent
Nakagawa et al.

(10) Patent No.: US 6,614,655 B2
(45) Date of Patent: Sep. 2, 2003

(54) METHOD OF CONTROLLING COOLING SYSTEM FOR A PERSONAL COMPUTER AND PERSONAL COMPUTER

(75) Inventors: Tsuyoshi Nakagawa, Hadano (JP); Kenichi Nagashima, Ebina (JP); Kenichi Saito, Tokyo (JP); Masahito Suzuki, Toyokawa (JP); Hajime Yamagami, Sagamihara (JP); Masato Kurita, Ebina (JP); Yasushi Neho, Atsugi (JP)

(73) Assignee: Hitachi, Ltd., Tokyo (JP)

( * ) Notice: Subject to any disclaimer, the term of this patent is extended or adjusted under 35 U.S.C. 154(b) by 119 days.

(21) Appl. No.: 09/796,648

(22) Filed: Mar. 2, 2001

(65) Prior Publication Data
US 2002/0075644 A1 Jun. 20, 2002

(30) Foreign Application Priority Data
Dec. 19, 2000 (JP) ........................ 2000-385050

(51) Int. Cl.[7] ................................ G06F 1/16
(52) U.S. Cl. ........................ 361/687; 361/723
(58) Field of Search ................... 361/687–723

(56) References Cited

U.S. PATENT DOCUMENTS 5,631,799 A * 5/1997 Sayka ................. 361/103

FOREIGN PATENT DOCUMENTS

| JP | 7-142886 | 6/1995 |
| JP | 11-154036 | 6/1999 |

* cited by examiner

Primary Examiner—Darren Schuberg
Assistant Examiner—Yean-Hsi Chang
(74) Attorney, Agent, or Firm—Mattingly, Stanger & Malur, P.C.

(57) ABSTRACT

In an information processing apparatus such as a space-saving type personal computer having a liquid-cooling type cooling system, the presence of a cooling liquid, the presence of a frozen state of the cooling liquid and the temperature of the cooling liquid are detected. When a freeze of the cooling liquid is detected, a CPU is throttled down to defrost the cooling liquid, or the cooling liquid is heated to be prevented from being frozen. Alternatively, a warning of detection of a freeze may be displayed. Alternatively, activation of the system may be stopped or operation of the system may be interrupted. By such measures, system failure is prevented from being caused by leaking, shortage, freezing, etc. of the cooling liquid.

18 Claims, 27 Drawing Sheets

FIG. 4

PARAMETER TABLE (FREQUENCY)

11a

| TEMPERATURE IN-FORMATION (T1)°C | TEMPERATURE IN-FORMATION (T2)°C | FREQUENCY SETTING VALUE | ALRT1 SIGNAL | ALRT2 SIGNAL | ALRT3 SIGNAL | CONTROL |
|---|---|---|---|---|---|---|
| 0°C OR LOWER | 0°C OR LOWER | STOP | OFF | OFF | ON | DEFROSTING |
| LOWER THAN 5°C | LOWER THAN 5°C | 40Hz | ON | OFF | OFF | FREEZE PREVENTION |
| LOWER THAN 40°C | 5°C OR HIGHER | STOP | OFF | OFF | OFF | PUMP STOP |
| 40°C | * | 30Hz | ON | OFF | OFF | PUMP OPERATION |
| 50°C | * | 35Hz | ON | OFF | OFF | |
| 60°C | * | 40Hz | ON | OFF | OFF | |
| 70°C | * | 45Hz | ON | OFF | OFF | |
| 80°C | * | 50Hz | ON | OFF | OFF | |
| 90°C | * | 55Hz | ON | OFF | OFF | |
| 100°C | * | 60Hz | ON | OFF | OFF | |
| 110°C | * | 60Hz | ON | OFF | ON | SHIFTING TO CPU THROTTLING (ABNORMAL STATE) |
| 120°C | * | STOP | OFF | ON | ON | SYSTEM SHUT DOWN (ABNORMAL STATE) |

*: INDEFINITE

FIG. 6

PARAMETER TABLE (VOLTAGE)

| TEMPERATURE IN-FORMATION (T1)°C | TEMPERATURE IN-FORMATION (T2)°C | VOLTAGE SETTING VALUE | ALRT1 SIGNAL | ALRT2 SIGNAL | ALRT3 SIGNAL | CONTROL |
|---|---|---|---|---|---|---|
| 0°C OR LOWER | 0°C OR LOWER | STOP | OFF | OFF | ON | DEFROSTING |
| LOWER THAN 5°C | LOWER THAN 5°C | 50V | ON | OFF | OFF | FREEZE PREVENTION |
| LOWER THAN 40°C | 5°C OR HIGHER | STOP | OFF | OFF | OFF | PUMP STOP |
| 40°C | * | 60V | ON | OFF | OFF | PUMP OPERATION |
| 50°C | * | 65V | ON | OFF | OFF | |
| 60°C | * | 70V | ON | OFF | OFF | |
| 70°C | * | 80V | ON | OFF | OFF | |
| 80°C | * | 90V | ON | OFF | OFF | |
| 90°C | * | 100V | ON | OFF | OFF | |
| 100°C | * | 110V | ON | OFF | OFF | |
| 110°C | * | 110V | ON | OFF | ON | SHIFTING TO CPU THROTTLING (ABNORMAL STATE) |
| 120°C | * | STOP | OFF | ON | ON | SYSTEM SHUT DOWN (ABNORMAL STATE) |

* : INDEFINITE

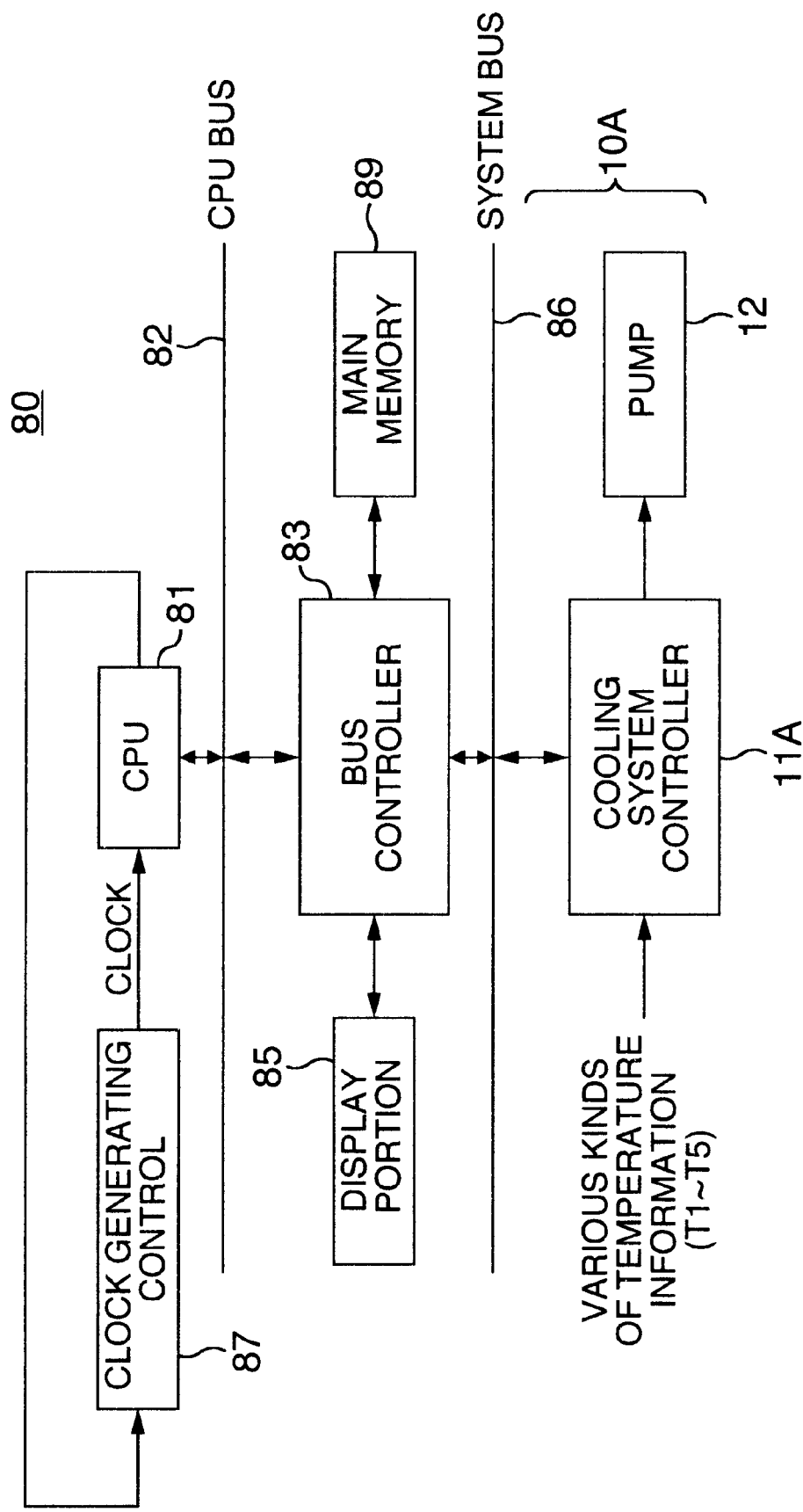

METHOD OF CONTROLLING COOLING SYSTEM FOR A PERSONAL COMPUTER AND PERSONAL COMPUTER

CROSS-REFERENCE TO RELATED APPLICATIONS

The present invention is related to (1) U.S. patent application Ser. No. 09/796,561 filed Mar. 2, 2001 entitled "METHOD OF CONTROLLING COOLING SYSTEM FOR A PERSONAL COMPUTER AND PERSONAL COMPUTER" claiming the Convention Priority based on Japanese Patent Application No. 2000-385050 and (2) U.S. patent application Ser. No. 09/796,458 filed Mar. 2, 2001 entitled "METHOD OF CONTROLLING COOLING SYSTEM FOR A PERSONAL COMPUTER AND PERSONAL COMPUTER" claiming the Convention Priority based on Japanese Patent Application No. 2000-385051.

BACKGROUND OF THE INVENTION

The present invention relates to a cooling technique and an information processing apparatus and particularly to a technique effectively adapted to a technique for cooling a space-saving type personal computer, or the like.

For example, with the advance of semiconductor techniques or the like, performance of a microprocessor used in a personal computer or the like has been improved remarkably. Particularly, a product with an operating frequency of the level of GHz has been used widely.

On the other hand, with the users' requirement for space saving and with reduction in cost of a liquid-crystal display, a so-called notebook type portable personal computer which has a liquid-crystal display and a body foldably connected to each other by a hinge has come into wide use. Moreover, an integral display type desktop personal computer which has a personal computer body integrated with the back or lower portion of a liquid-crystal display has come into wide use.

When a high-performance microprocessor with the level of GHz is mounted in such a space-saving type personal computer to provide the personal computer as a product, one of technical problems is means how to cool the microprocessor (to radiate heat from the microprocessor).

It is heretofore known that a cooling fan is disposed near the microprocessor or in a part of a housing so that the cooling fan forcedly generates an air stream passing through the microprocessor portion to radiate heat.

In the air-cooling system using such a fan, however, heat radiation has become insufficient because a large amount of heat is sent out when the existing high-speed microprocessor with the level of GHz is in operation. If heat radiation is to be made forcedly, a large-sized fan is required. There arises another technical problem in increase of the fan size and the housing size, increase of power consumption, increase of noise, or the like.

In such a space-saving type personal computer, there are sale points in small size, low noise, low power consumption, etc. Hence, increase in size of the housing, increase in power consumption and increase in noise as described above is a large technical problem against producing a space-saving type personal computer.

Therefore, it has been conceived that a liquid-cooling type cooling system using liquid as a thermal medium to thereby make it possible to achieve a large cooling capacity is employed in the conventional information processing apparatus.

SUMMARY OF THE INVENTION

An object of the present invention is to provide a technique in which reduction in size, noise and power consumption can be achieved in an information processing apparatus such as a space-saving type personal computer or the like and, at the same time, high performance can be achieved by use of a microprocessor with a high operating frequency.

Such a space-saving type personal computer is used in various locations or in various temperature environments. For example, the personal computer may be used in a cold district, or the like. Hence, in a personal computer which employs a liquid-cooling type cooling system using a liquid thermal medium to make it possible to achieve a large cooling capacity, cooling characteristic is deteriorated because of freezing, leaking, or the like, of the thermal medium. Hence, there is fear that failure such as system malfunction, thermal damage of the system, etc. may be caused by overheating of the microprocessor.

The present invention releases or prevents the freezing of the thermal medium in the following manner so as to prevent failure such as system malfunction, thermal damage of the system, etc.

According to an aspect of the present invention, there is provided a method of controlling a cooling system for cooling a heat-generating portion of an information processing apparatus. In the information processing apparatus which has an information processing portion and an information display portion integrated with each other, the cooling method is performed by circulating a thermal medium between a cooling jacket mounted on the heat-generating portion and a heat-radiating portion. The cooling method comprises steps of: making a judgment as to whether the thermal medium is frozen or not when the information processing apparatus is activated; and executing at least one of the processes of defrosting the thermal medium, issuing a warning and stopping the activation of the information processing apparatus, when a freeze of the thermal medium is detected.

According to another aspect of the present invention, a freeze of the thermal medium is judged at a point of time preset by a timer prior to the activation of the information processing apparatus, so that the thermal medium is defrosted when a freeze of the thermal medium is detected.

According to a further aspect of the present invention, a freeze of the thermal medium is avoided in the following manner. The temperature of the thermal medium is monitored regardless of the operating state of the information processing apparatus. When the temperature is not higher than a threshold, freezing of the thermal medium is avoided by execution of at least one of a method of forcedly circulating the thermal medium and a method of heating the thermal medium by a heating means provided in the circulation path of the thermal medium.

BRIEF DESCRIPTION OF THE DRAWINGS

FIG. 4 is an explanatory view showing an example of the operating condition in FIG. 3;

FIG. 6 is an explanatory view showing an example of the operating condition in FIG. 5;

FIG. 27 is a conceptual view showing an example of the configuration of the information processing apparatus.

DETAILED DESCRIPTION OF THE EMBODIMENTS

Figure 1:
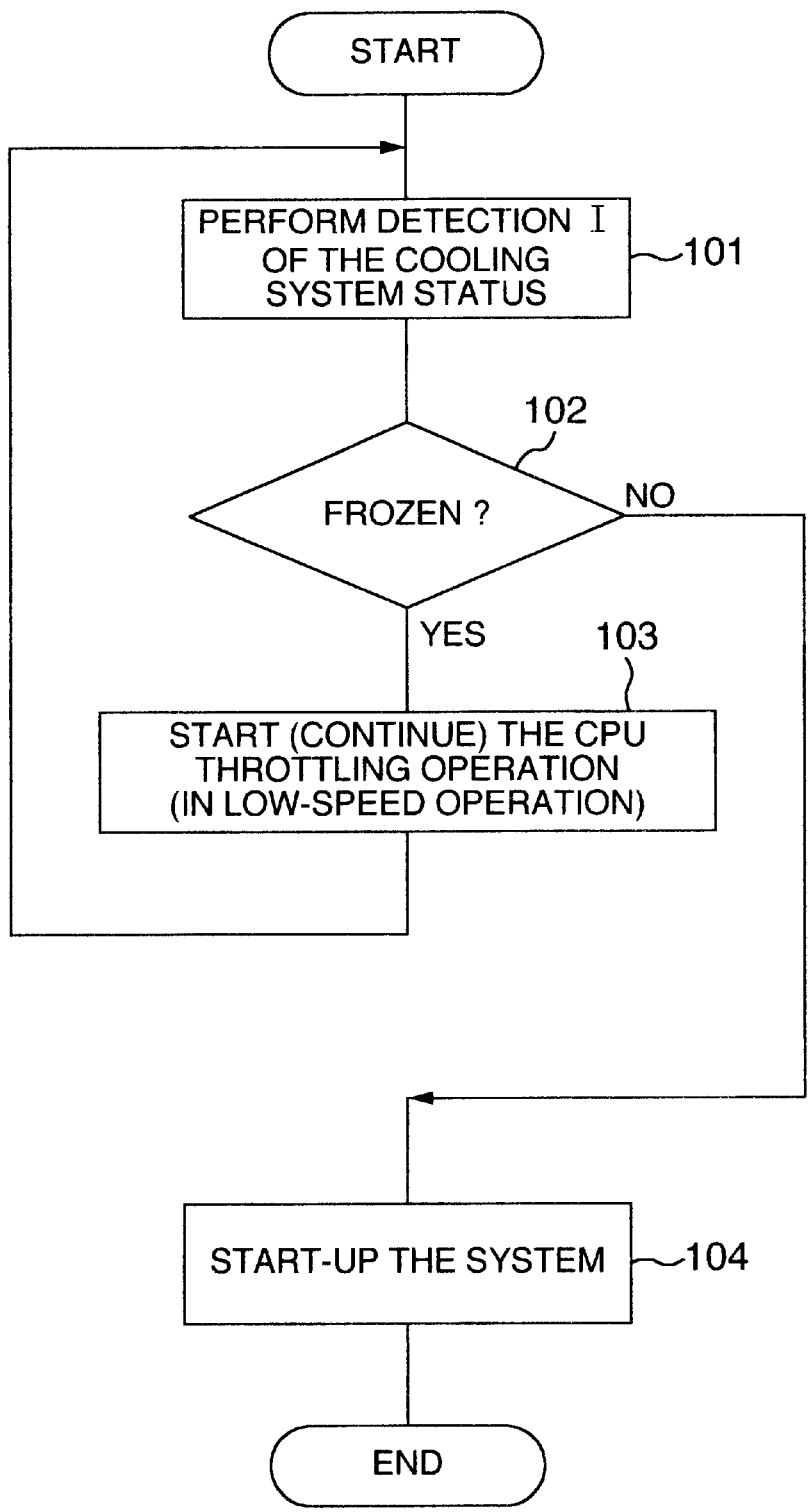
FIG. 1 is a flow chart showing an example of a frozen-state process.
Figure 2:
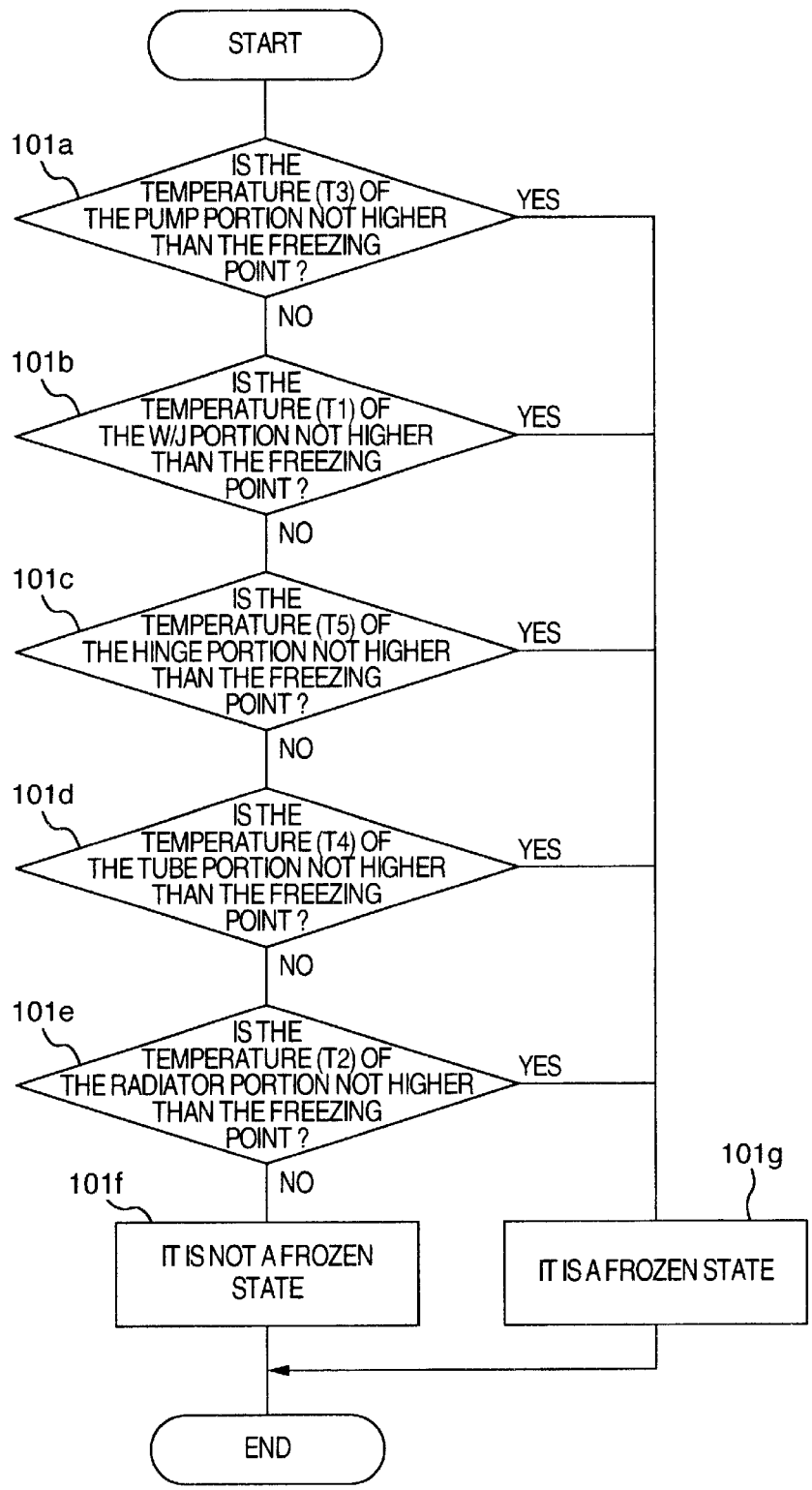
FIG. 2 is a flow chart showing another example of the frozen-state process.
Figure 3:
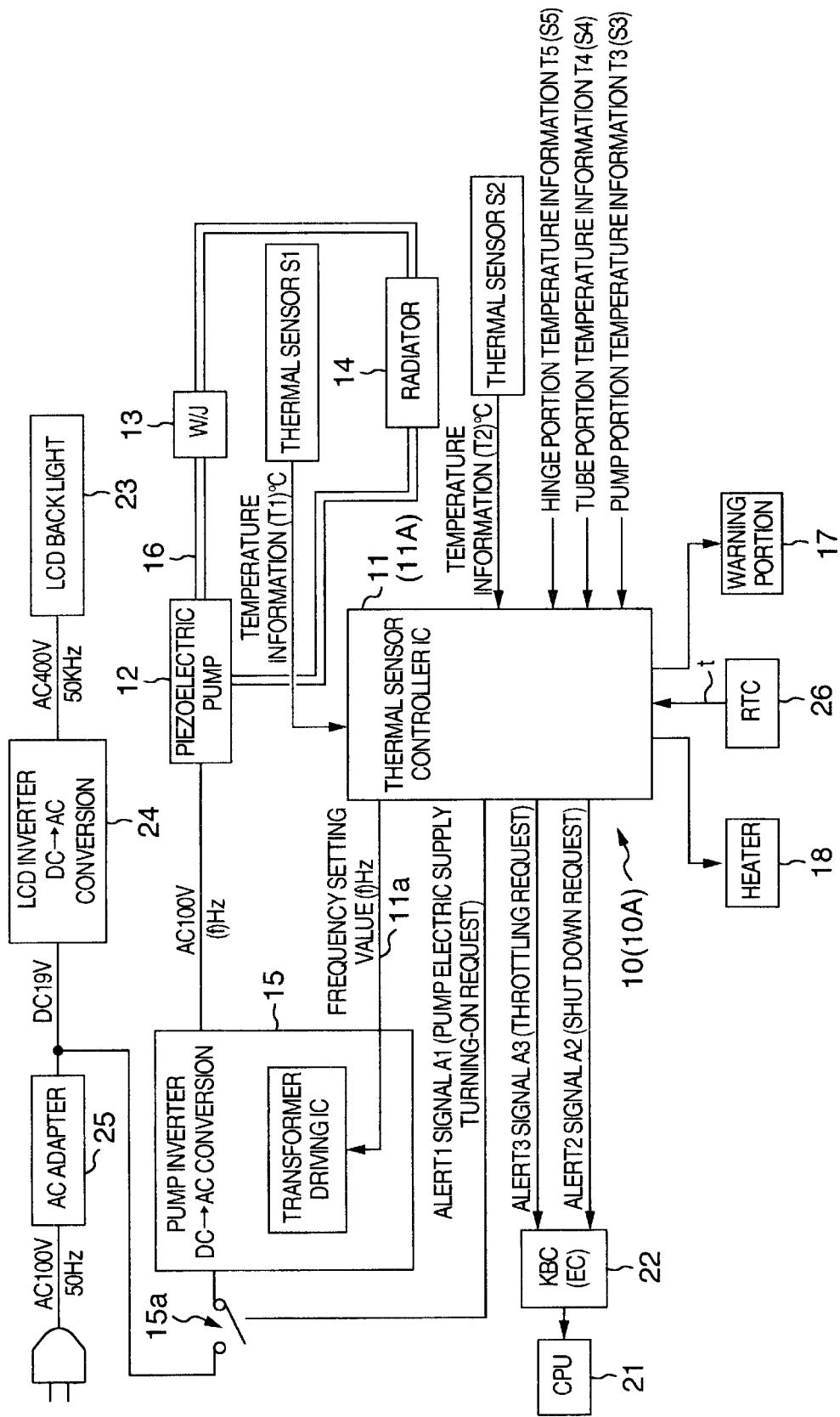
FIG. 3 is a conceptual view showing an example of the configuration of the frozen-state process.
Figure 5:
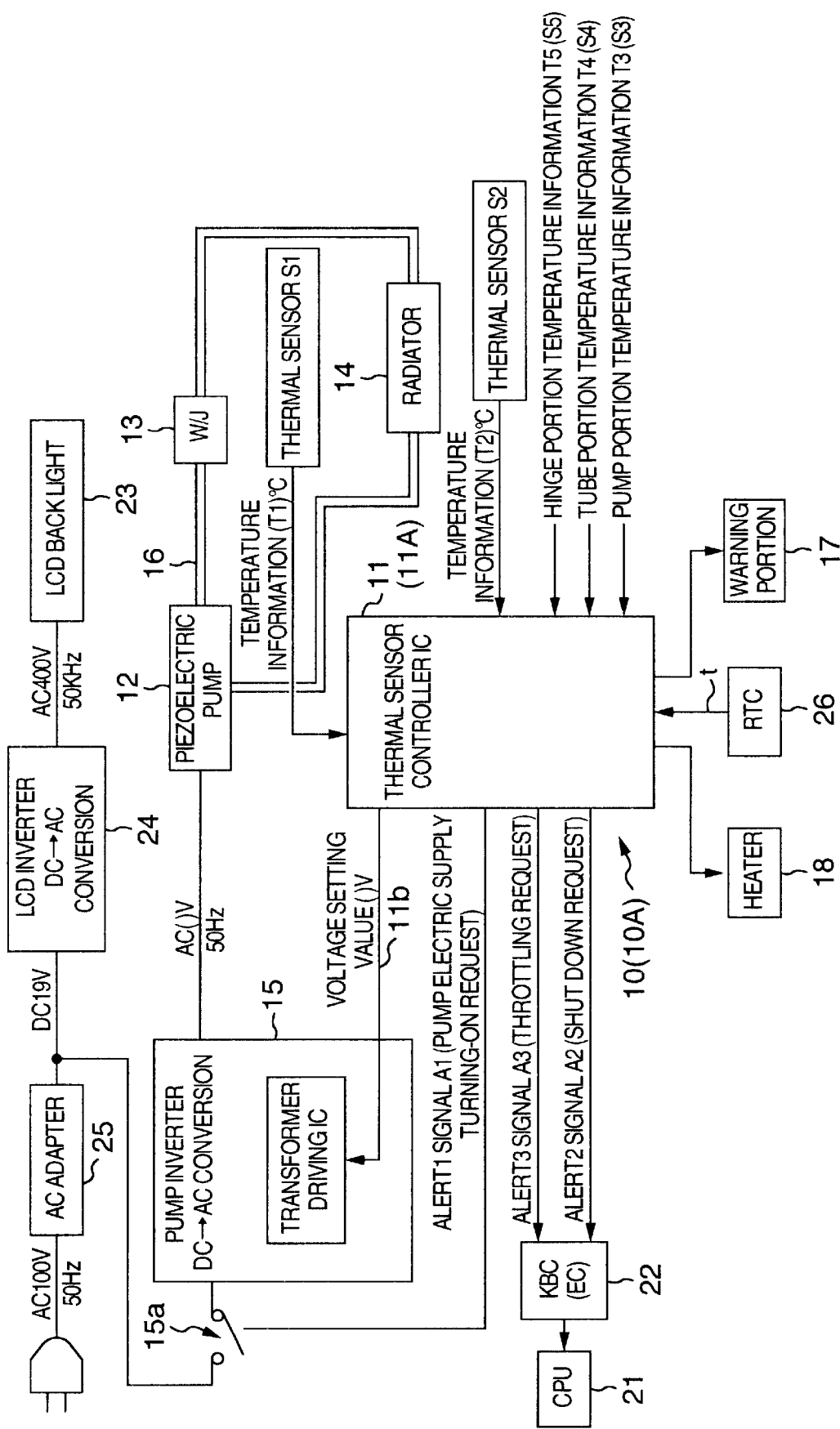
FIG. 5 is a conceptual view showing a modified example of the configuration of the frozen-state process.
Figure 7:
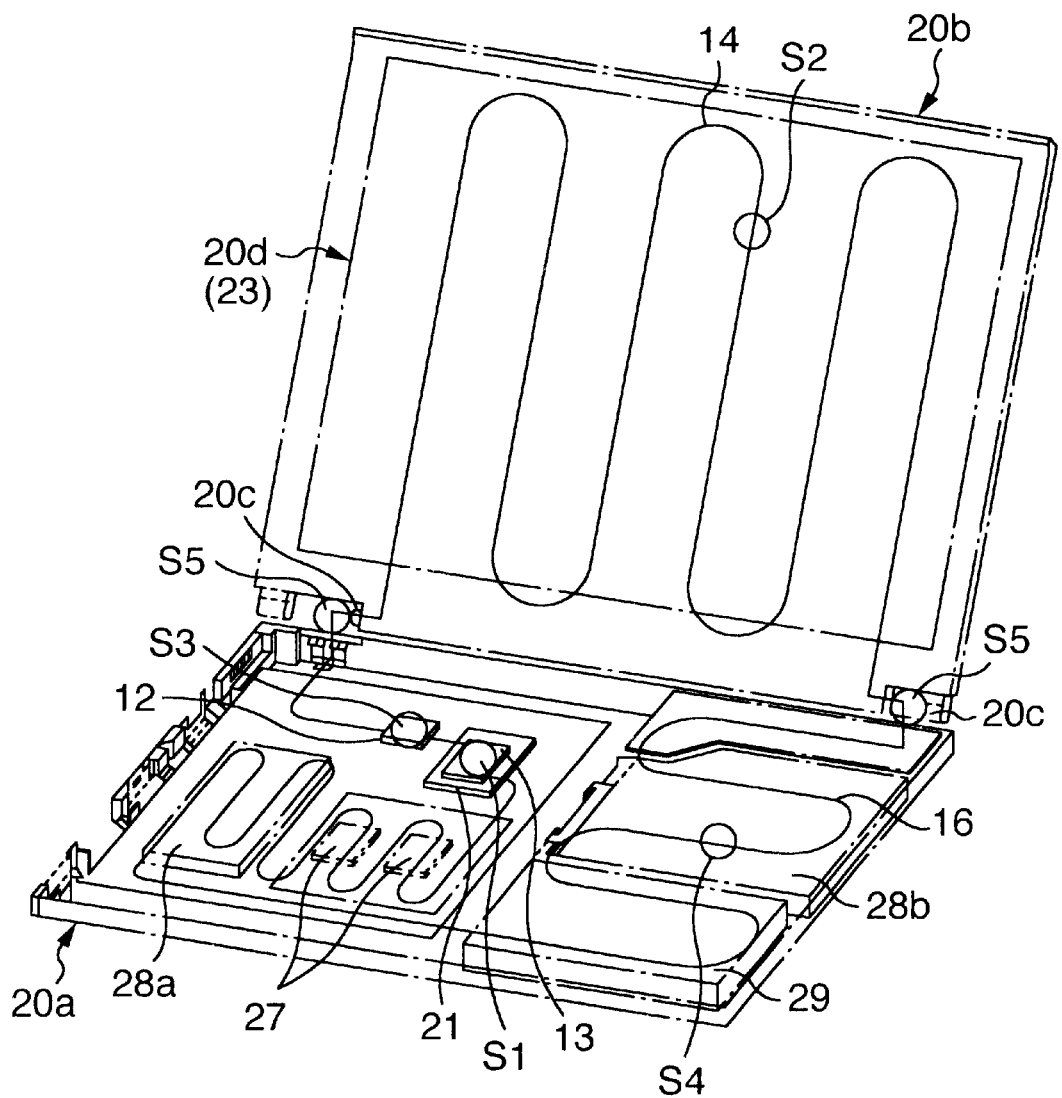
FIG. 7 is a perspective view showing an example of the internal structure of an information processing apparatus.
Figure 8:
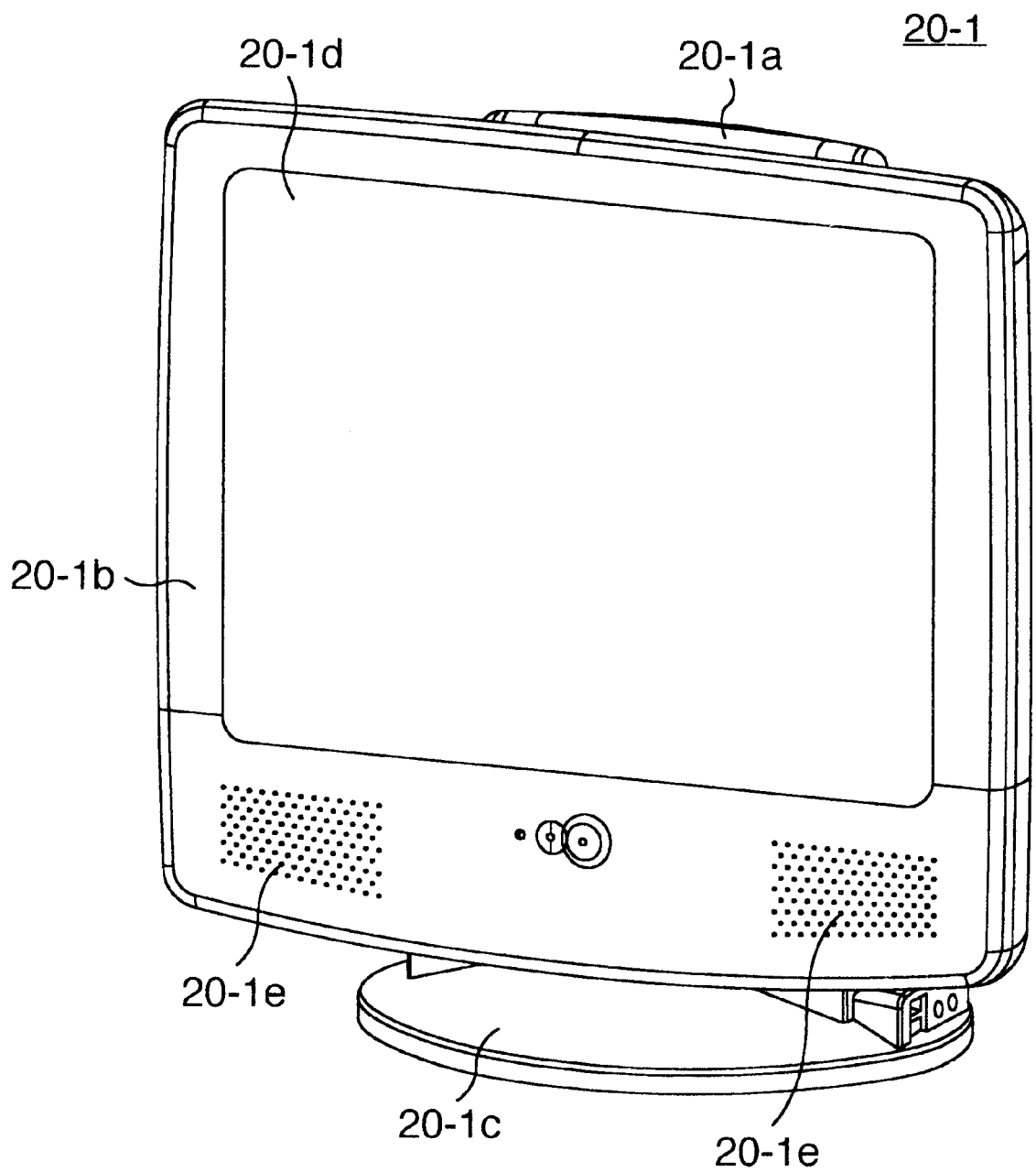
FIG. 8 is a perspective view showing an example of the external appearance of the information processing apparatus.
Figure 9:
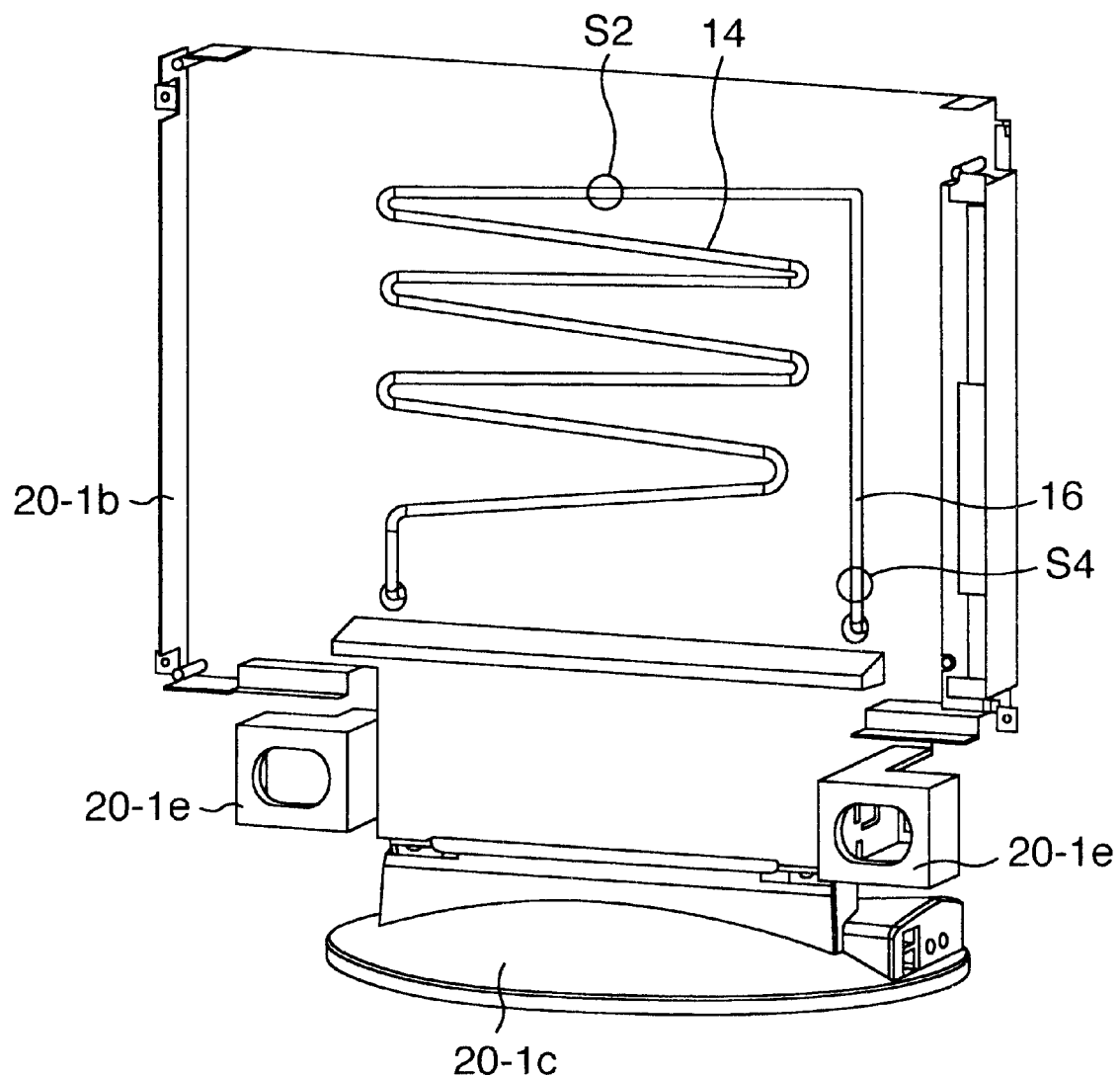
FIG. 9 is a perspective view showing an example of the internal structure of the information processing apparatus.
Figure 10:
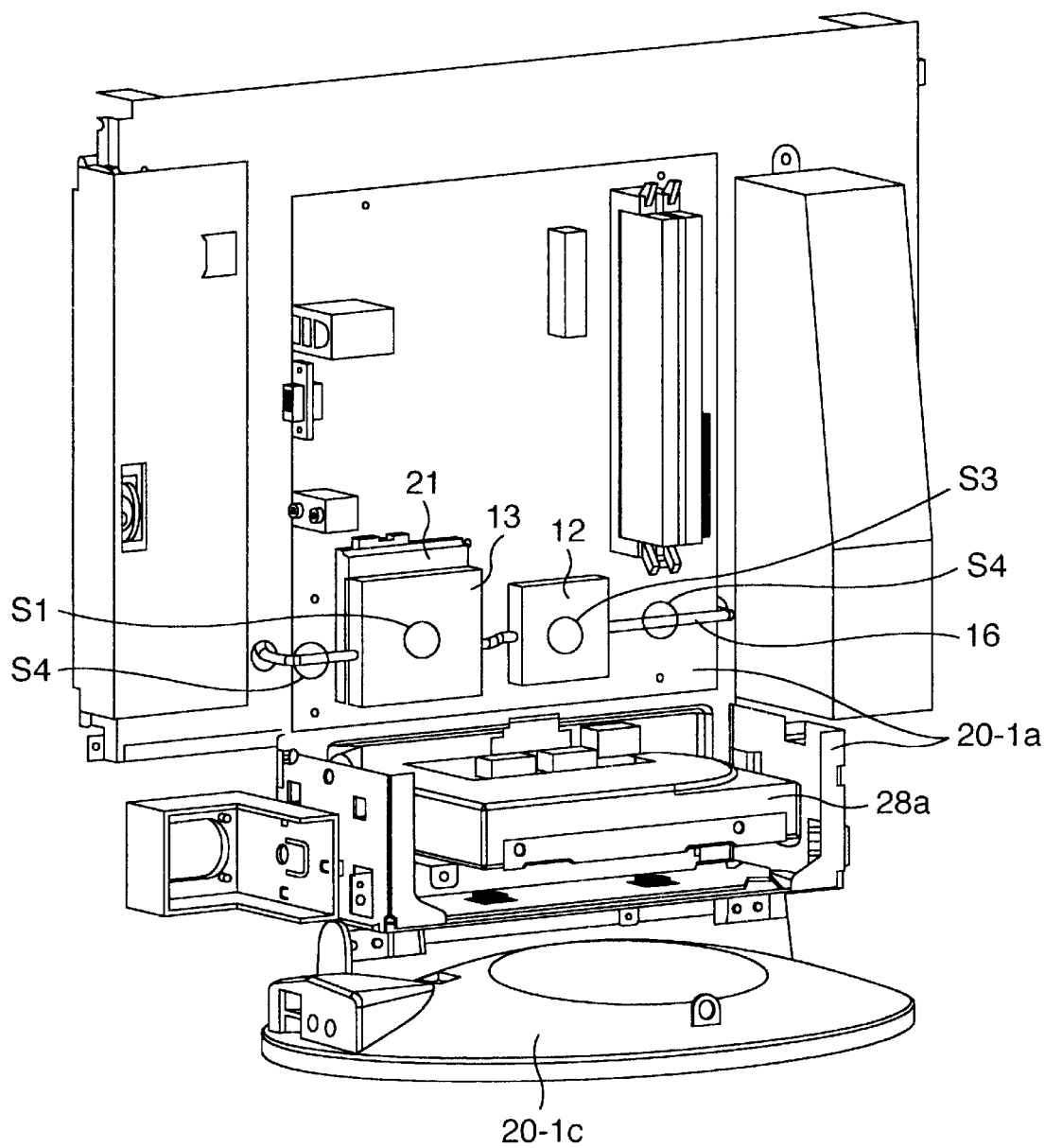
FIG. 10 is a perspective view showing another example of the internal structure of the information processing apparatus.

FIGS. 1 and 2 are flow charts showing an example of the operation of an information processing apparatus having a cooling system for carrying out a cooling method according to an embodiment of the present invention. FIGS. 3 and 5 are conceptual views showing an example of the configuration of the cooling system in the information processing apparatus according to this embodiment. FIGS. 4 and 6 are perspective views showing an example of the operation of the cooling system. FIG. 7 is a perspective view showing an example of the internal structure of the information processing apparatus according to this embodiment. FIG. 8 is a perspective view showing an example of the external appearance of another information processing apparatus according to this embodiment. FIGS. 9 and 10 are perspective views showing an example of the internal structure of the another information processing apparatus.

As shown in FIG. 3, a cooling system 10 according to this embodiment comprises: a control portion 11 such as a thermal sensor control IC for totally controlling the cooling system 10; a cooling jacket 13 mounted on a CPU 21 such as a microprocessor constituting an information processing apparatus 20 which will be described later; a radiator 14 for radiating heat; a pump 12 for forcedly circulating a thermal medium M between the cooling jacket 13 and the radiator 14 through a tube 16; a pump driving portion 15 for driving the pump 12; a thermal sensor S1 for detecting the temperature of the cooling jacket 13 and supplying the detected temperature as temperature information T1 to the control portion 11; and a thermal sensor S2 for detecting the temperature of the radiator 14 and supplying the detected temperature as temperature information T2 to the control portion 11.

The pump driving portion 15 is supplied with operating electric power through a switch 15a from an AC adapter 25. The AC adapter 25 also supplies electric power to an LCD inverter 24 and the LCD inverter 24 drives an LCD back light 23 constituting an information processing apparatus 20 which will be described later.

As occasion demands, thermal sensors S3 to S5, or the like, may be connected to the control portion 11. The thermal sensor S3 is mounted on the pump 12 and supplied with the temperature of the pump 12 as temperature information T3. The thermal sensor S4 is mounted on the tube 16 and supplied with the temperature of the tube 16 as temperature information T4. The thermal sensor S5 is supplied with the temperature of the tube 16 passing through the hinge of a notebook type information processing apparatus 20 as temperature information T5. The hinge of the notebook type information processing apparatus 20 will be described later.

Further, as occasion demands, the control portion 11 may control the operation of a heater 18 mounted on the radiator 14.

Still further, as occasion demands, the control portion 11 may control a warning portion 17 mounted thereon to sound an alarm, or the like, to the outside.

A real-time clock 26 constituted by a calendar IC and equipped with a backup power supply may be further provided in the information processing apparatus 20 and connected to the control portion 11 so that the control portion 11 can obtain time information t as occasion demands.

The control portion 11 has a control function for controlling the operation of the pump 12, the warning portion 17, the heater 18, or the like, by supplying the quantity of control to the pump driving portion 15 through a control interface 11a and by turning on/off the switch 15a through an ALERT1 signal A1 in accordance with at least one of the five kinds of temperature information T1, T2, T3, T4 and T5 and one kind of time information t obtained from the real-time clock 26.

FIG. 4 is a parameter table (frequency) showing examples of various kinds of parameters set in the controlling operation of the control portion 11 in accordance with measured results of temperature information T1 and T2.

FIG. 3 shows an example of the configuration in the case where the control portion 11 uses the driving frequency of the pump 12 as a control interface 11a to be given to the pump driving portion 15 in order to control the pump 12. That is, the control portion 11 sets operating electric power with a frequency in a transformer driving IC 15b contained in the pump driving portion 15, and the pump driving portion 15 supplies the set operating electric power with the frequency to the pump 12 to thereby control the ON/OFF and flow rate of the pump 12.

FIGS. 5 and 6 show a modified example in the case where the control portion 11 uses the driving voltage of the pump 12 as a control interface 11b given to the pump driving portion 15 in order to control the pump 12. That is, the control portion 11 sets operating electric power with a voltage in the transformer driving IC 15b contained in the pump driving portion 15, and the pump driving portion 15 supplies the set operating electric power with the voltage to the pump 12 to thereby control the ON/OFF and flow rate of the pump 12.

Although the examples of settings of parameters in FIGS. 4 and 6 illustrate temperature values in the case where, for example, water with a freezing temperature of 0° C. is used as the thermal medium M, it is a matter of course that various changes may be made in accordance with the freezing temperature of the thermal medium M.

The control portion 11 sends out an ALART2 signal A2 and an ALART3 signal A3 to a keyboard controller 22 provided in the information processing apparatus 20 so that the control portion 11 can perform the status control of the information processing apparatus 20 such as shutdown processing for stopping the operation of the information processing apparatus 20 totally by a normal procedure, CPU throttling for operating the CPU 21 with an operating frequency lower than the rating frequency, or the like.

That is, in the information processing apparatus 20 such as a personal computer, or the like, shutdown processing and CPU throttling can be executed by a specific keyboard operation. The control portion 11 achieves the shutdown processing and CPU throttling by generating an equivalent state to the specific keyboard operation in the inside of the keyboard controller 22 on the basis of the ALART2 signal A2 and the ALART3 signal A3.

These control functions of the control portion 11 can be achieved by a built-in microcomputer not shown, or the like.

An example of the configuration of the information processing apparatus 20 according to this embodiment will be described below with reference to FIG. 7. The information processing apparatus 20 illustrated in FIG. 7 is constituted by a so-called notebook type space-saving personal computer comprising a body unit 20a and a display unit 20b which are integrated with and connected to each other foldably through a hinge portion 20c.

The body unit 20a includes a CPU 21, a peripheral chip 27 such as a bus controller, an external storage device 28a such as a magnetic disk device, an external storage device 28b for driving a commutative recording medium such as a CD-ROM, and a body driving battery 29 and further includes a keyboard controller 22, a real-time clock 26, and an LCD inverter 24 which are not shown in FIG. 7.

The display unit 20b includes a liquid-crystal panel 20d, and an LCD back light 23 which is not shown in FIG. 7 but disposed on the back of the liquid-crystal panel 20d.

In this embodiment, the cooling jacket 13 of the cooling system 10 is amounted so as to come into contact with the CPU 21 of the body unit 20a. The pump 12 is amounted to a neighbor of the CPU. The radiator 14 is disposed on the back side of the liquid-crystal panel 20d of the display unit 20b. The tube 16 is drawn around through the hinge portion 20c so as to connect the cooling jacket 13, the pump 12 and the radiator 14 to one another. In the example of FIG. 7, the tube 16 is drawn around so as to pass over the peripheral chip 27, the external storage devices 28a and 28b and the body driving battery 29.

The thermal sensor S1 is disposed on the cooling jacket 13. The thermal sensor S2 is disposed on the radiator 14.

As occasion demands, the thermal sensor S3 may be disposed in contact with the pump 12, the thermal sensor S4 may be disposed in a portion of the hinge portion 20c through which the tube 16 passes, and the thermal sensor S5 may be disposed on a part of the drawing path of the tube 16 (in the example of FIG. 7, the thermal sensor S5 is disposed on the upper portion of the external storage device 28b).

The configuration of a different type space-saving information processing apparatus 20-1 according to this embodiment will be described below with reference to FIGS. 8 to 10.

The information processing apparatus 20-1 comprises a body unit 20-1a, a display unit 20-1b, and a swivel base 20-1c. The body unit 20-1a is integrally connected to the back side of the display unit 20-1b and supported on the swivel base 20-1c so as to freely swivel and tilt back and forth.

As illustrated in FIG. 10 or the like, the body unit 20-1a includes a CPU 21, and an external storage device 28a such as a magnetic disk device, and further includes a keyboard controller 22, a real-time clock 26 and an LCD inverter 24 which are not shown in FIG. 7.

The display unit 20-1b includes a liquid-crystal panel 20-1d, a not-shown LCD back light 23 disposed on the back of the liquid-crystal panel 20-1d, and speakers 20e on opposite sides of the lower portion of the display unit 20-1b.

In the information processing apparatus 20-1, the cooling jacket 13 of the cooling system 10 is mounted so as to come into contact with the CPU 21 of the body unit 20-1a. The pump 12 is mounted on a neighbor of the cooling jacket 13. The radiator 14 is disposed on the back side of the liquid-crystal panel 20-1d of the display unit 20-1b. The tube 16 is drawn around while piercing a frame portion, or the like, for supporting the liquid-crystal panel 20-1d. Accordingly, the tube 16 connects the cooling jacket 13 and the pump 12 on the body unit 20-1a side and the radiator 14 on the liquid-crystal panel 20-1d side to one another.

The thermal sensor S1 is disposed on the cooling jacket 13. The thermal sensor S2 is disposed on the radiator 14.

As occasion demands, the thermal sensor S3 may be disposed so as to come into contact with the pump 12, and the thermal sensor S5 may be disposed on a part of the drawing path of the tube 16 (in the example of FIG. 10, the thermal sensors S5 are disposed near the cooling jacket 13 and near the pump 12 respectively).

An example of the operation of this embodiment will be described below with reference to the flow charts of FIGS. 1 and 2, or the like.

When switching on of a power supply for the information processing apparatus 20 is detected, the process illustrated in the flow chart of FIG. 1 starts. First, the control portion 11 executes the detection I of the cooling system status as illustrated in FIG. 2 (step 101). A judgement is made as to whether the thermal medium M in the cooling system 10 is frozen or not (step 102). If the thermal medium M is not frozen, a system starting-up process is executed (step 104).

In the detection I of the cooling system status illustrated in FIG. 2, a judgement is made as to whether the temperature information detected by each thermal sensor is not higher than the freezing point of the thermal medium M or not, as shown in the steps 101a to 101e. If a value not higher than the freezing point is detected in any one of the thermal sensors, a judgment is made that the thermal medium M is frozen (step 101g). If all the detected temperature values are not lower than the freezing point, a judgment is made that the thermal medium M is not frozen (step 101f).

Although FIG. 2 illustrates the example where all temperature information detected by the thermal sensors S1 to S5 are judged for illustration convenience, the present invention may be applied also to the case where at least one temperature value is used.

On the other hand, when a freeze is detected in the step 102, the control portion 11 supplies an ALART3 signal A3 to the keyboard controller 22 so that the operation of the CPU 21 is shifted to a CPU throttling state in which the CPU 21 is operated at a low speed (in a low heat generation quantity) with a frequency lower than the rating operating frequency in the ordinary running state (step 103). After the step 103, the detection I of the cooling system status in the step 101, the freeze-judgement in the step 102 and CPU throttling in the step 103 are continued until the frozen state is released. When the frozen state is released, the situation of the routine shifts to the system starting-up process shown in the step 104.

In this embodiment, the liquid-cooling type cooling system 10 using the thermal medium M is used for cooling the CPU 21, etc. Hence, a large cooling capacity can be achieved compared with the air-cooling type cooling system or the like. Hence, reduction in size, noise and power consumption can be achieved in the information processing apparatus such as a space-saving personal computer and, at the same time, high performance can be achieved by use of a microprocessor with a high operating frequency.

Moreover, when the system is to be activated, the judgment is first made as to whether the thermal medium M in the cooling system 10 is frozen or not, the thermal medium M is then defrosted (released from the frozen state) by use of heat generated by CPU throttling on the basis of the judgment, the system activating process is at last executed. Hence, overheating failure of the CPU 21 can be steadily prevented from being caused by the full-loading state of the CPU 21 with a large amount of heat generated in the condition that the thermal medium M is still frozen.

Moreover, heat generated in the CPU throttling is used so effectively that the frozen state of the thermal medium M can be released automatically and efficiently.

Another embodiment of the present invention in which the cooling liquid is defrosted by a heater when a freeze of the cooling liquid is detected will be described below.

Figure 11:
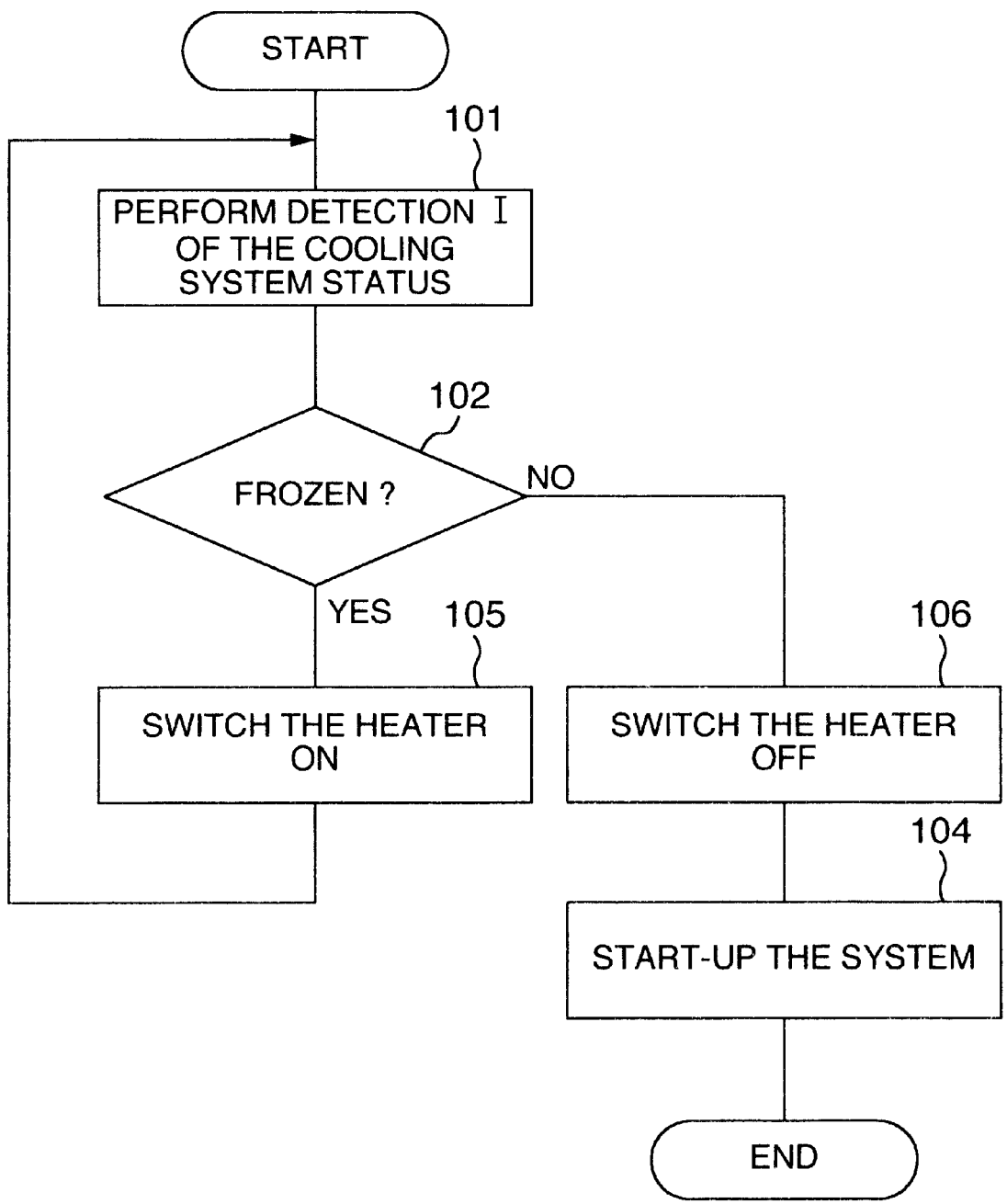
FIG. 11 is a flow chart showing an example of a freeze-preventing process.
Figure 12:
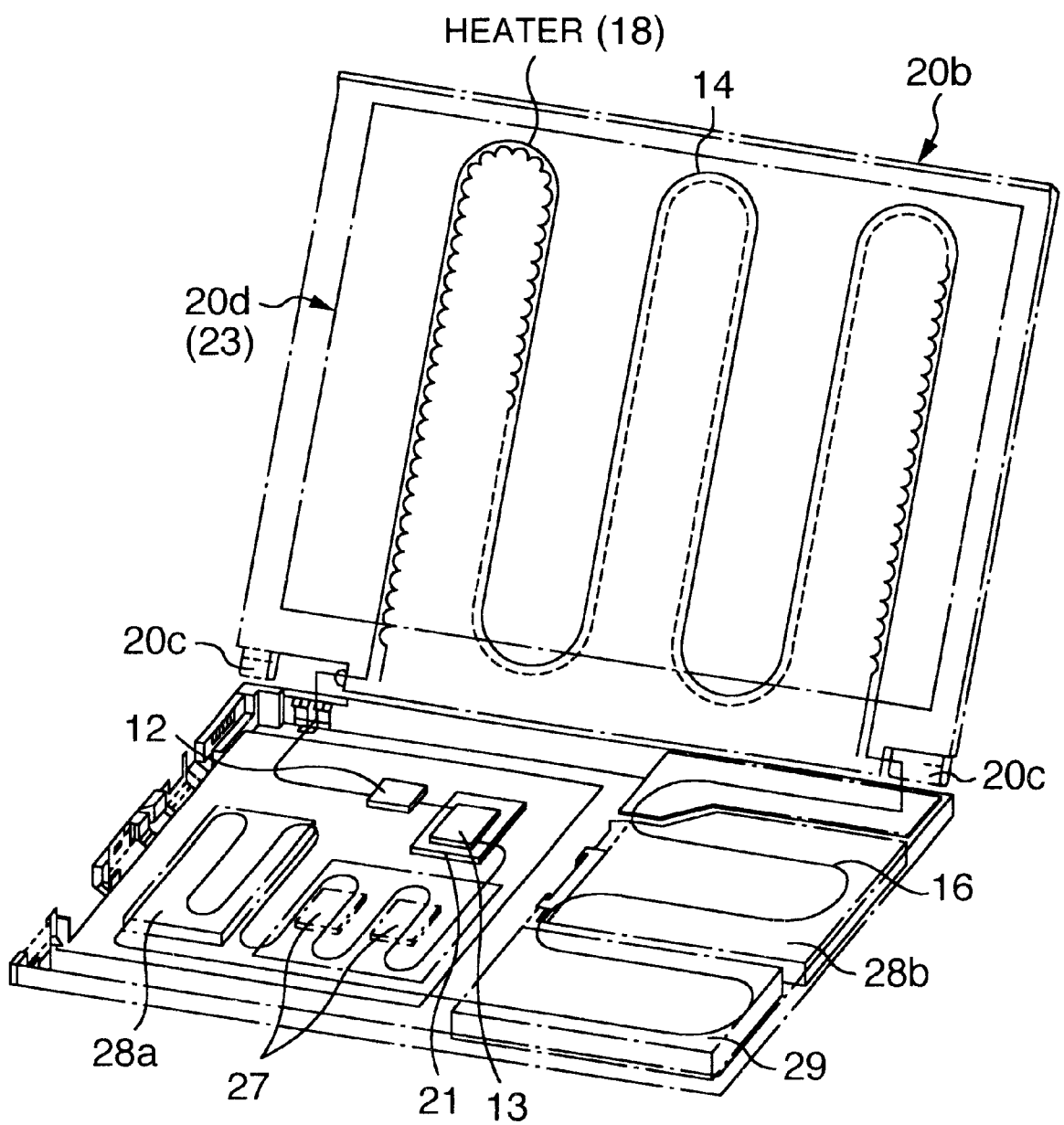
FIG. 12 is a perspective view showing an example of the configuration of the freeze-preventing process.

FIG. 11 is a flow chart showing an example of the operation of another embodiment of the present invention. FIG. 12 is a perspective view showing an example of the configuration of the information processing apparatus 20 according to this embodiment.

In this embodiment, a heater 18 is mounted on the radiator 14 constituting the cooling system 10 so that, when the thermal medium M is frozen, the heater 18 is operated to defrost the thermal medium M. Although the example of FIG. 12 illustrates the configuration that the heater 18 is selectively mounted on the radiator 14, it is a matter of course that the heater 18 may be mounted on a part or a whole of the other portion of the circulation path of the thermal medium M in the cooling system 10.

That is, first, the control portion 11 executes the detection I of the cooling system status as illustrated in FIG. 2 (step 101). A judgement is made as to whether the thermal medium M in the cooling system 10 is frozen or not (step 102). When the thermal medium M is not frozen, the system starting-up process is executed (step 104).

On the other hand, when a freeze is detected in the step 102, the control portion 11 switches the heater 18 on to start heating by the radiator 14 (step 105). Then, the detection I of the cooling system status in the step 101, the freeze judgment process in the step 102 and the heating process by use of the heater 18 in the step 105 are continued until the frozen state is released. When the frozen state is released, the control portion 11 switches the heater 18 off (step 106) and the situation of the routine goes to the step 104 so as to perform the system starting-up process.

Incidentally, the defrosting process shown in the flow chart of FIG. 11 may be executed when the information processing apparatus 20 is to be started up or at any other optional opportunity (for example, when the information processing apparatus 20 is left).

The same effect as in the previous embodiment can be obtained in this embodiment. Moreover, this embodiment has an advantage in that heating failure of the system such as a CPU 21 owing to a freeze of the thermal medium M can be avoided because the thermal medium M can be defrosted without use of CPU throttling of the CPU 21, that is, regardless of the presence of the CPU throttling function.

Figure 13:
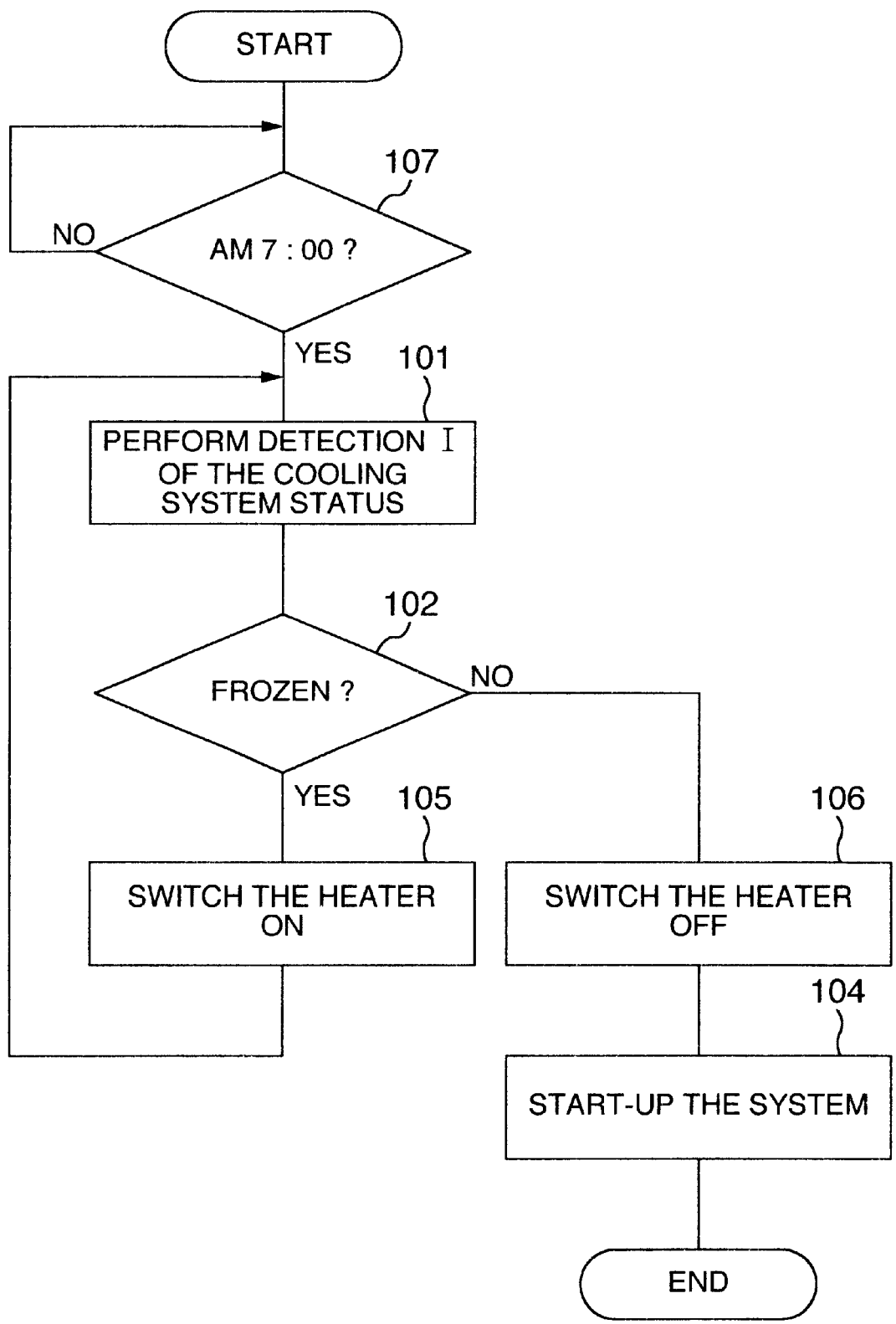
FIG. 13 is a flow chart showing an example in which a frozen-state process is performed by activation of a timer.

FIG. 13 is a flow chart showing an example of the operation of an embodiment in which a frozen state of the thermal medium M is judged at a predetermined point of time so that the defrosting process can be performed as occasion demands.

In this embodiment, the control portion 11 in the cooling system 10 monitors time information obtained from a real-time clock 26. A judgment is made as to whether it is the predetermined point of time or not (for example, in the example of FIG. 13, 7 a.m. which is a point of time before the information processing apparatus 20 is supposed to be used) (step 107). When arrival of the predetermined point of time is detected, the frozen state of the thermal medium M is judged and, as occasion demands, the defrosting process shown in FIG. 11 is performed. Step numerals for the same processes in FIGS. 11 and 13 are referenced correspondingly so that the description of the steps will be omitted.

The real-time clock 26 is operated by a backup battery not shown, or the like. Hence, the real-time clock 26 is ticking regardless of the activation state of the information processing apparatus 20.

In this embodiment, a freeze of the thermal medium M in the cooling system 10 can be detected to be released before the information processing apparatus 20 begins to be used. Hence, because the time waiting for defrosting the thermal medium M can be cut when the information processing apparatus 20 begins to be used, this embodiment has an advantage in that the information processing apparatus 20 can be used efficiently.

Figure 14:
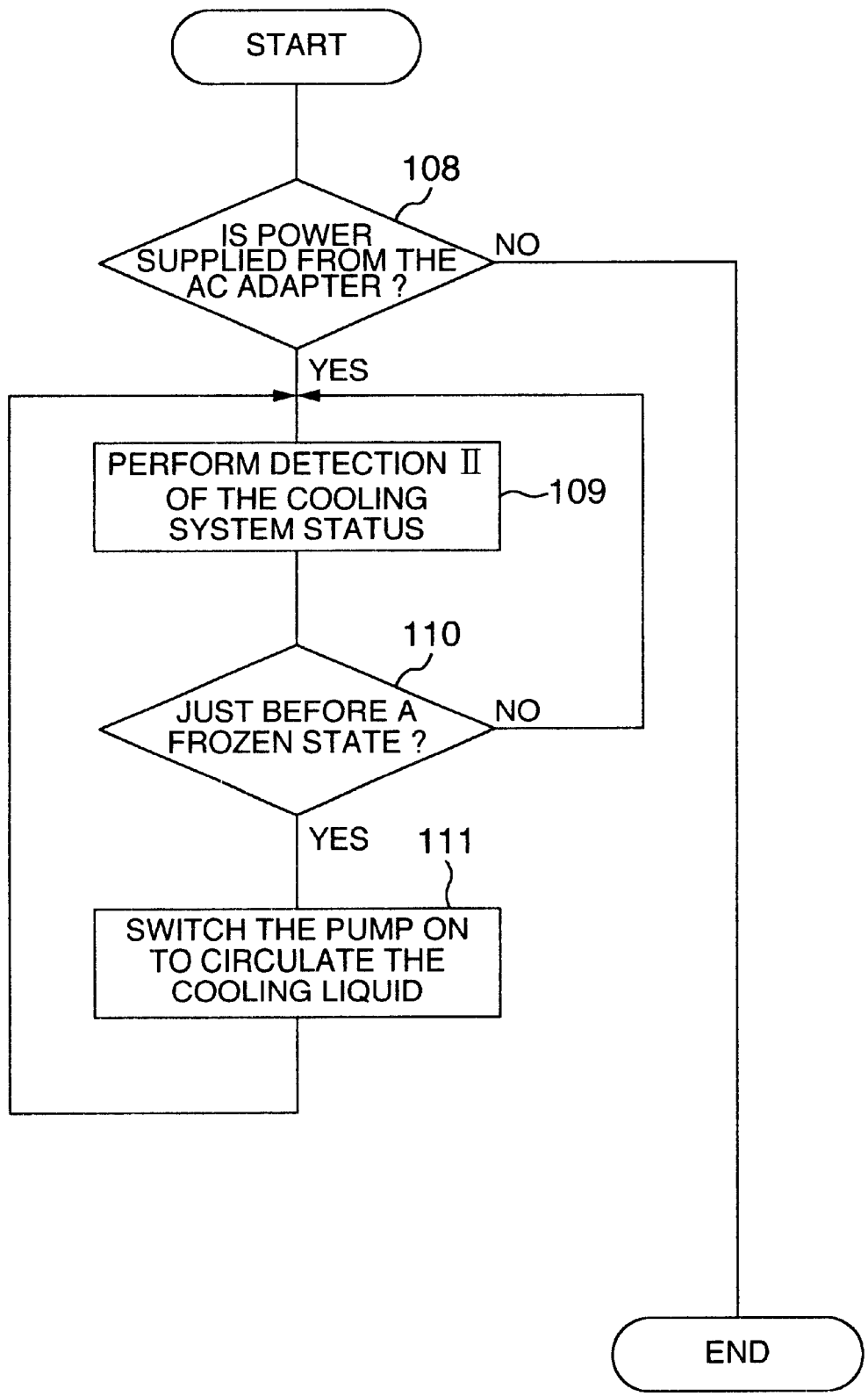
FIG. 14 is a flow chat showing another example of the freeze-preventing process.
Figure 15:
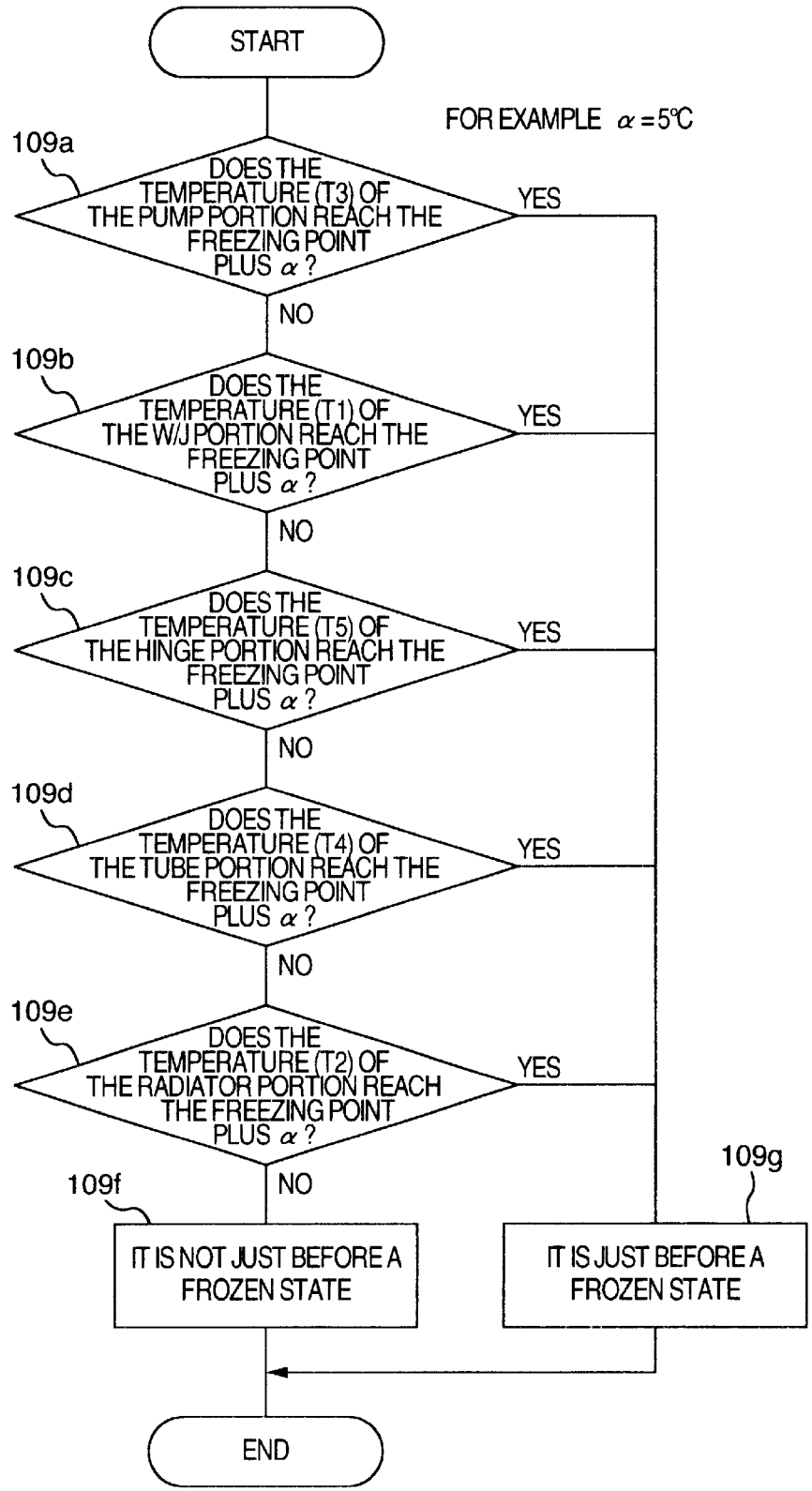
FIG. 15 is a flow chart showing a detailed example of status detection in FIG. 14.

FIGS. 14 and 15 are flow charts showing an example of the operation of an embodiment in which the cooling liquid is prevented from being frozen.

In this embodiment, a freeze of the thermal medium M is predicted so that a freeze-preventing operation is carried out. In this embodiment, the control portion 11 in the cooling system 10 can be operated by a not-shown backup battery in the same manner as that in the real-time clock 26 regardless of the activation state of the information processing apparatus 20 such as regardless of switching on/off of the power supply for the information processing apparatus 20.

That is, at an any opportunity, the control portion 11 in the cooling system 10 makes a judgment as to whether there is power supply from the AC adapter 25 or not (step 108).

When such a decision that power can be supplied is made, the control portion 11 executes the detection II of the cooling system status illustrated in the flow chart of FIG. 15 which will be described later (step 109). When such a decision that the cooling system 10 is just going to be frozen is made (step 110), the control portion 11 activates the pump 12 to perform a freeze-preventing operation for forcedly circulating the thermal medium M in the tube 16 (step 111). The control portion 11 continues the freeze-preventing operation in the steps 109 to 111 until the state in which the thermal medium M is just going to be frozen is released.

That is, as illustrated in FIG. 15, in the detection II of the cooling system status, if at least one of the pump temperature (temperature information T3), the cooling jacket temperature (temperature information T1), the hinge temperature (temperature information T5), the tube temperature (temperature information T4) and the radiator temperature (temperature information T2) is detected to be lower than its freezing point plus α (steps 109a to 109e), a decision is made that the thermal medium M is before a frozen state (step 109g). Otherwise, a decision is made that the thermal medium M is not just before a frozen state (step 109f). In this manner, a freeze of the thermal medium M is predicted.

Assuming that the value of α is 5° C. and that water (with a freezing temperature of 0° C.) is used as the thermal medium M, a decision is made that the thermal medium M is just going to be frozen, when at least one of the temperature information T1 to T5 concerning the thermal medium M is lower than 5° C.

Figure 16:
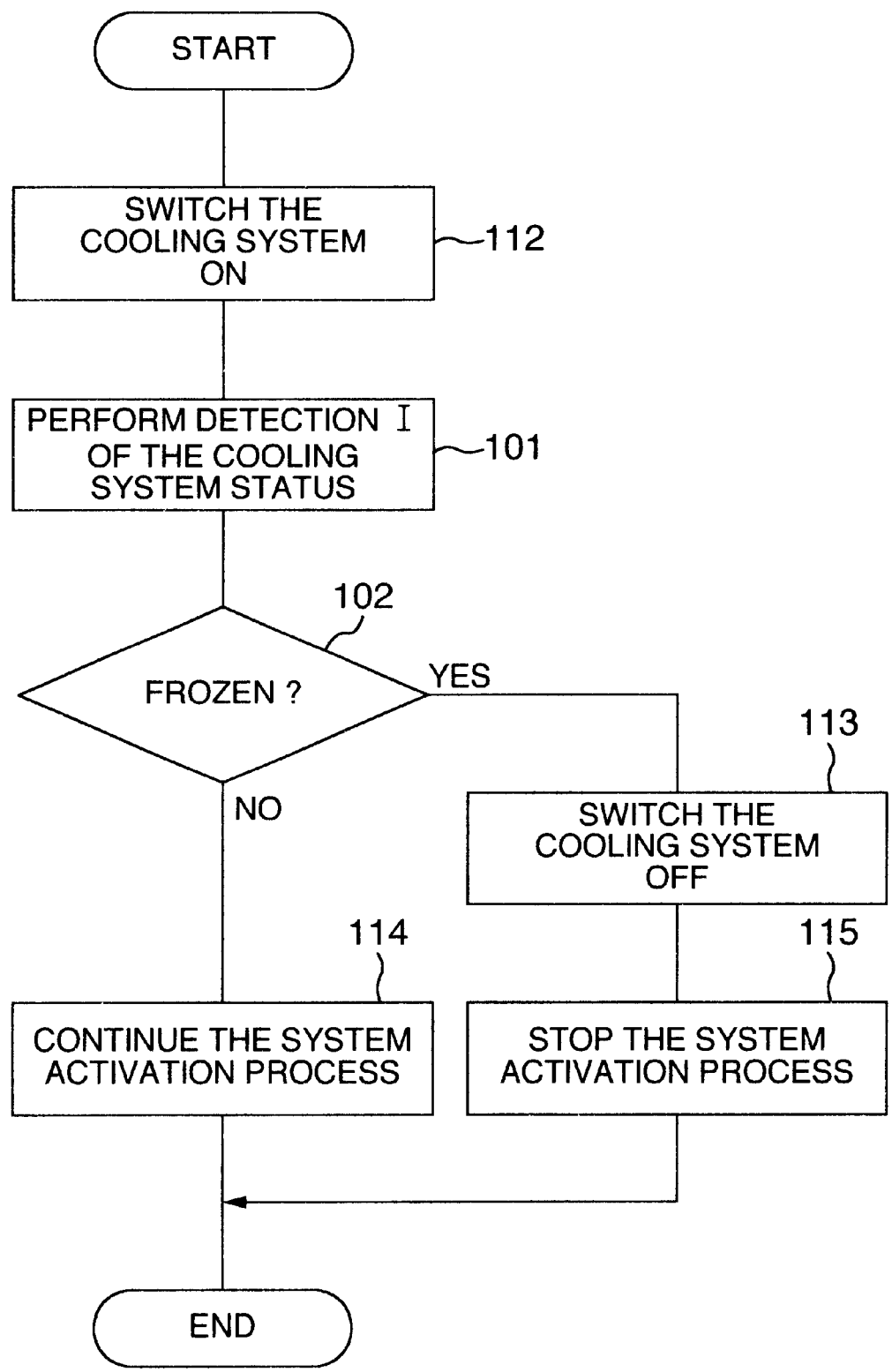
FIG. 16 is a flow chart showing a further example of the frozen-state process.

FIG. 16 is a flow chart showing an example of the operation of another embodiment of the process in a frozen state.

In this embodiment, when the information processing system 20 is to be activated, the cooling system 10 is activated (step 112). A judgment is made as to whether the cooling system 10 is frozen or not (steps 101 and 102). When a decision is made that the cooling system 10 is frozen, the cooling system 10 is stopped (step 113). At the same time, the activation (bootstrap, etc.) of the information processing system 20 is also stopped. When the cooling system 10 is not frozen, the activation (bootstrap, etc.) of the information processing apparatus 20 is continued (step 114).

When the information processing system 20 is to be activated, a judgment is first made as to whether there is a freeze in the cooling system 10 or not and the activation of the information processing apparatus 20 is then stopped. Also by such a simple operation, failure can be steadily prevented from being caused by the continuation of the activation of the information processing apparatus 20 when the cooling system 10 is frozen.

Figure 17:
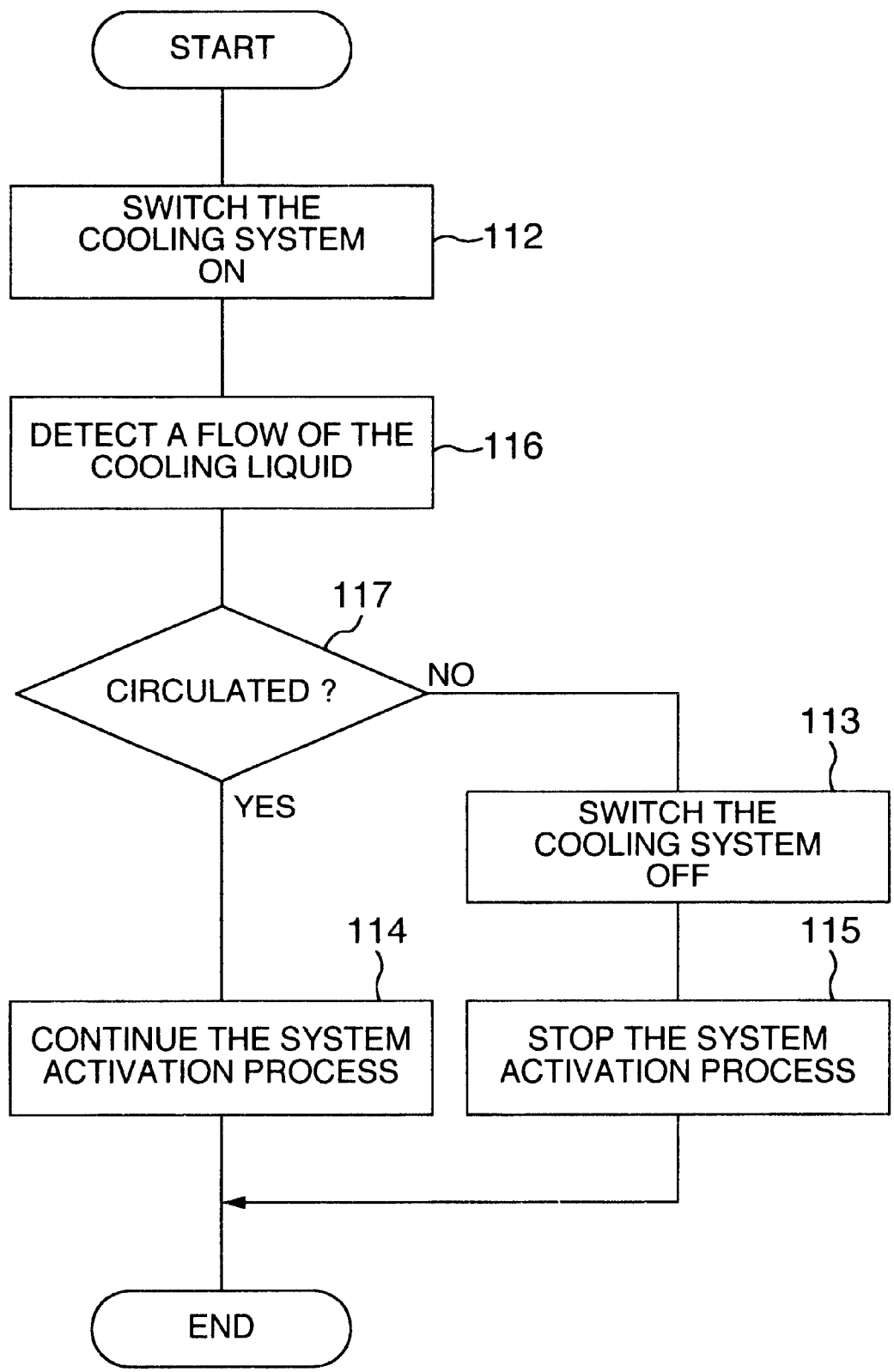
FIG. 17 is a flow chart showing an example of a method for checking shortage of a cooling liquid.

FIG. 17 is a flow chart showing an example of the operation of an embodiment in the case where the cooling liquid runs short.

In this embodiment, when the information processing apparatus is to be activated, the cooling system 10 is activated (step 112). A flow of the thermal medium M (cooling liquid) in the cooling system 10 is detected (step 116). A judgment is made as to whether the thermal medium M is circulated or not (step 117). When the thermal medium M is not circulated, the cooling system 10 is regarded as abnormal and the cooling system 10 is stopped (step 113). At the same time, the activation process (bootstrap, etc.) of the information processing apparatus 20 is also stopped (step 115). When the thermal medium M is circulated, the cooling system 10 is regarded as normal and the activation (bootstrap, etc.) of the information processing apparatus 20 is continued (step 114).

Figure 18:
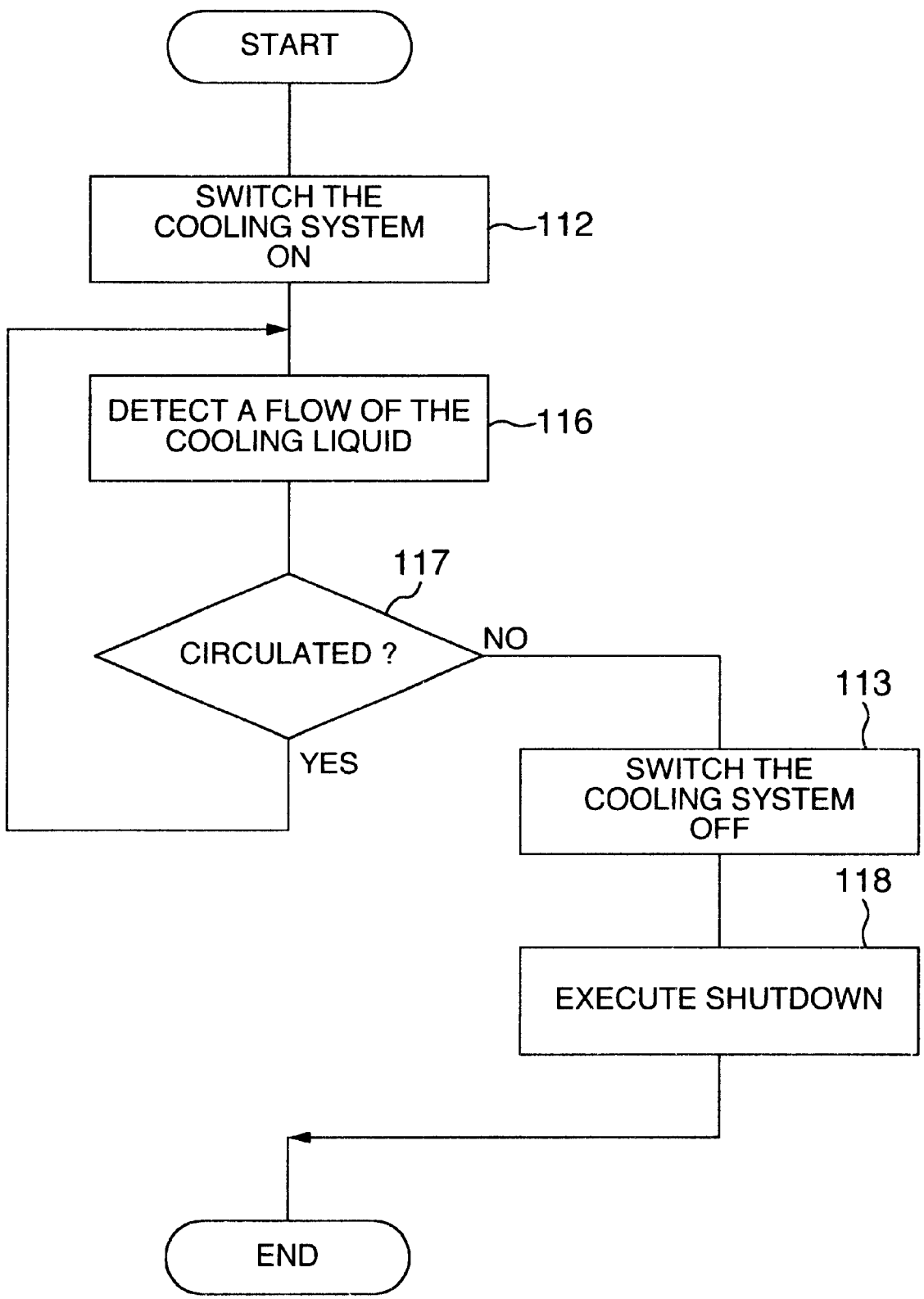
FIG. 18 is a flow chart showing another example of the method for checking shortage of the cooling liquid.

Alternatively, as illustrated in the flow chart of FIG. 18, the detection of a flow of the thermal medium M may be executed when the information processing apparatus 20 is in operation.

That is, after the information processing apparatus 20 and the cooling system 10 are activated (step 112), a flow of the thermal medium M (cooling liquid) is detected while the information processing apparatus 20 and the cooling system 10 are in operation normally (step 116). The process of making a judgment as to whether the thermal medium M is circulated or not (step 117) is performed continuously. When detection is made that the thermal medium M is not circulated, the cooling system 10 is regarded as abnormal and the cooling system 10 is stopped (step 113). At the same time, a shutdown process for stopping the operation of the information processing apparatus 20 is executed (step 118).

An example of the method for detecting a flow of the thermal medium M (cooling liquid) in the step 116 in FIGS. 17 and 18 will be illustrated below.

Figure 19A:
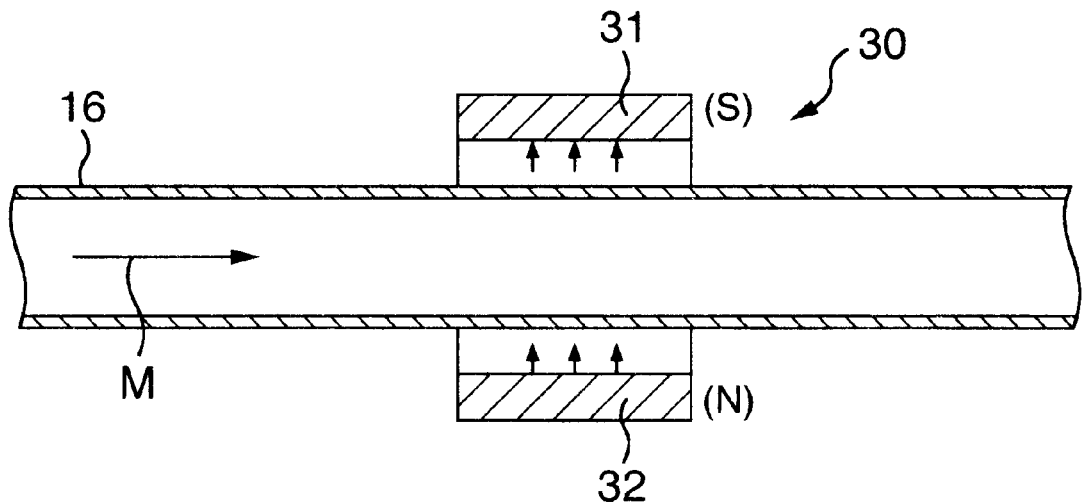
FIGS. 19A and 19B are conceptual views showing an example of a method for detecting a flow of the cooling liquid.
Figure 19B:
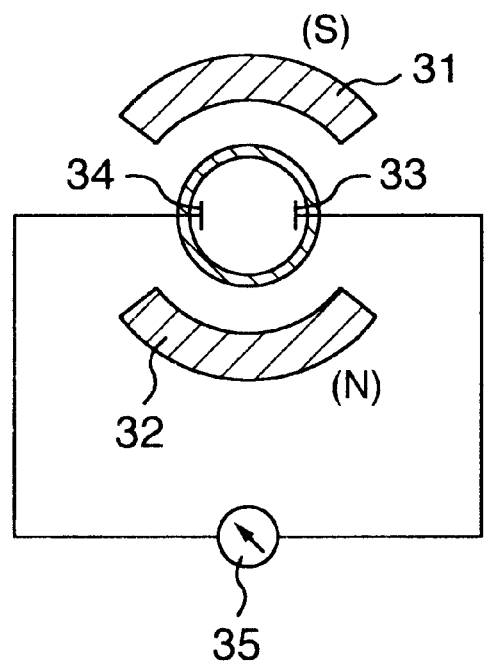

FIGS. 19A and 19B are conceptual views showing an example of the method for detecting a flow of the thermal medium M. In the example of FIGS. 19A and 19B, there is shown the method for detecting a flow of the thermal medium M by a flow sensor 30 which is made of an electromagnetic flow meter and which is disposed on the tube 16 through which the thermal medium M passes. The flow sensor 30 is constituted by a pair of magnetic poles 31 and 32, a pair of electrodes 33 and 34 and a voltmeter 35. The pair of magnetic poles 31 and 32 form a magnetic field in a direction perpendicular to the direction of the flow of the thermal medium M in the tube 16. The pair of electrodes 33 and 34 are disposed in the tube 16 in a direction perpendicular to the magnetic field. The voltmeter 35 is disposed to measure the value of electromotive force which is generated between the electrodes 33 and 34 on the basis of the flow rate of the thermal medium M so as to be proportional to the flow rate of the thermal medium M. The voltmeter 35 sends out the value of electromotive force, as the flow rate value of the thermal medium M, to the control portion 11 of the cooling system 10. In this case, the thermal medium M needs to have electrically conductive characteristic.

Figure 20:
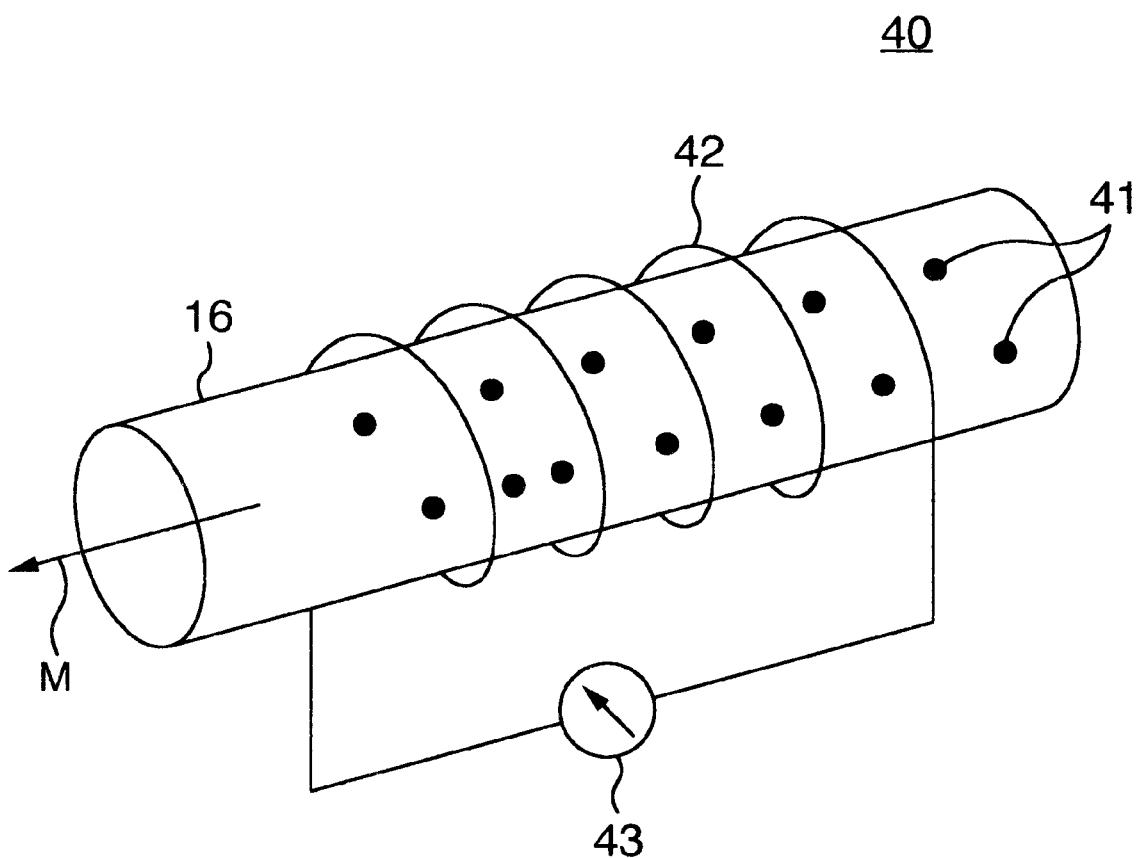
FIG. 20 is a conceptual view showing another example of the method for detecting a flow of the cooling liquid.

FIG. 20 is a conceptual view showing another example of the means for detecting a flow of the thermal medium M. The flow sensor 40 illustrated in FIG. 20 has magnetic substance particles 41 mixed in the thermal medium M, a solenoid 42 wound on the tube 16 through which the thermal medium M passes, and a voltmeter 43 for measuring a voltage generated in the solenoid 42 and sending out the measured voltage value to the control portion 11. That is, when the thermal medium M flows in the tube 16, the solenoid 42 wound on the tube 16 is axially moved by the magnetic substance particles 41 mixed in the thermal medium M. On this occasion, a voltage corresponding to the moving speed of the magnetic substance particles 41 (the flow rate of the thermal medium M) is generated in the solenoid 42. Hence, the flow rate of the thermal medium M can be measured on the basis of the voltage measured by the voltmeter 43.

Figure 21A:
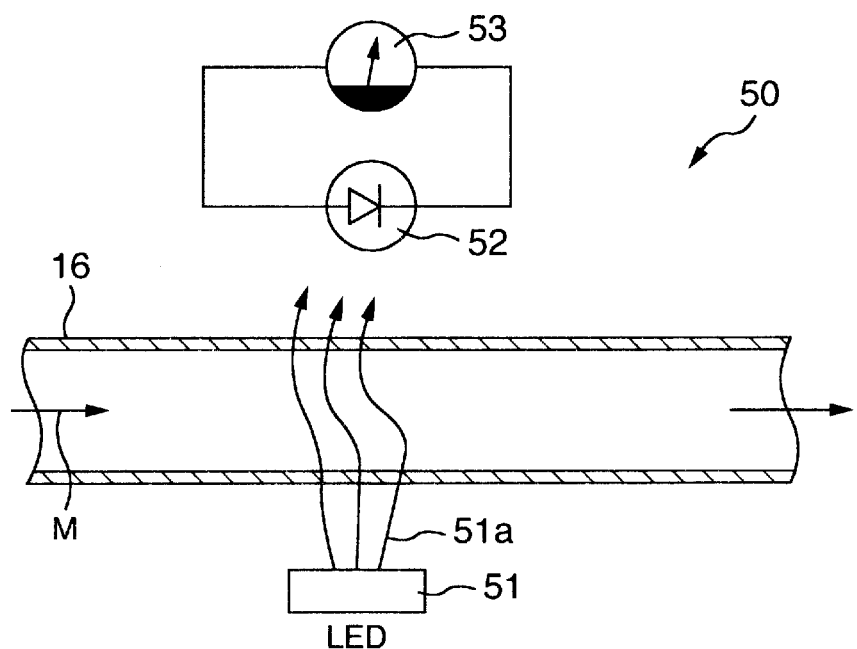
FIGS. 21A and 21B are conceptual views showing a further example of the method for detecting a flow of the cooling liquid.
Figure 21B:
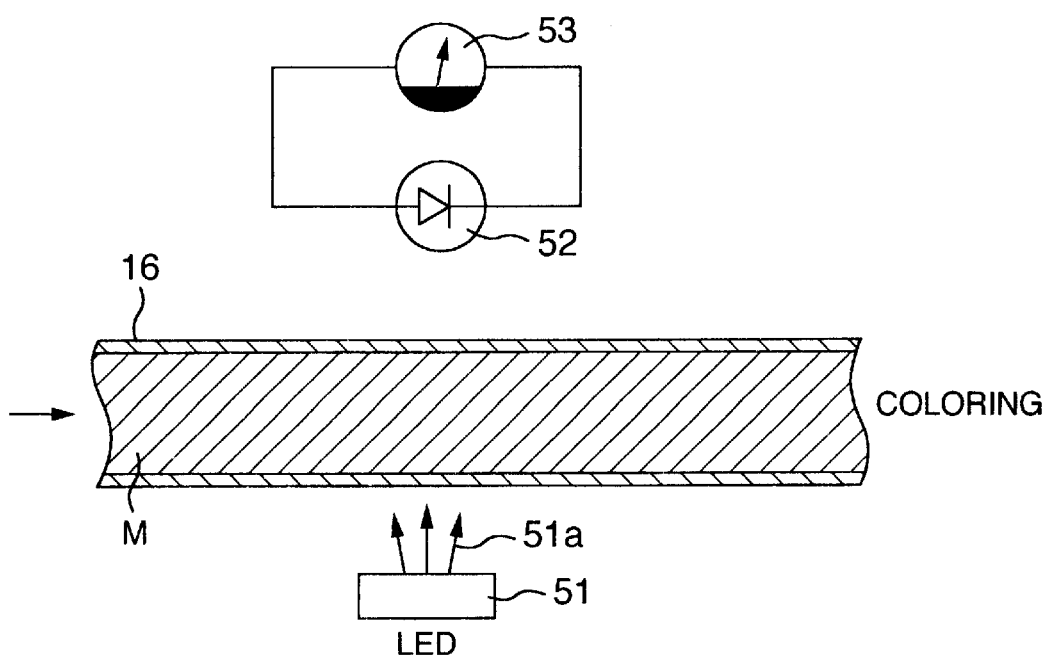

FIGS. 21A and 21B are conceptual views showing further examples of the method for detecting a flow of the thermal medium M. The flow sensor 50 illustrated in FIG. 21A has a light source 51, a photo sensor 52 and a voltmeter 53. The light source 51 and the photo sensor 52 are disposed so as to be opposite to each other with respect to the tube 16, and the voltmeter 53 is disposed to measure a voltage generated in the photo sensor 52 in accordance with the quantity of inspection light 51a incident onto the photo sensor 52 from the light source 51 via the tube 16 (and the thermal medium M flowing in the tube 16). In this case, a material for the tube 16 needs to have transparency by a certain degree or higher with respect to the inspection light 51a.

Variation (fluctuation) in flow rate, refractive index, etc. in the direction of transmission of the inspection light 51a occurs in the thermal medium M flowing in the tube 16. Hence, the quantity of the transmitted inspection light 51a incident onto the photo sensor 52 varies with the passage of time. Hence, the voltage detected by the voltmeter 53 is fluctuated. On the other hand, when the thermal medium M is stationary (the flow of the thermal medium M is stopped), the fluctuation is not detected. Hence, in this case, the voltage detected by the voltmeter 53 does not vary with the passage of time, that is, the voltage is kept constant. By use of this difference, the control portion 11 detects whether the thermal medium M is flowing in the tube 16 or not.

Alternatively, as shown in FIG. 21B, the thermal medium M may be colored so that the sensitivity in detection of the presence of a flow of the thermal medium M can be increased by detection of the passage of a fine bubble, or the like, mixed in the thermal medium M.

Figure 22A:
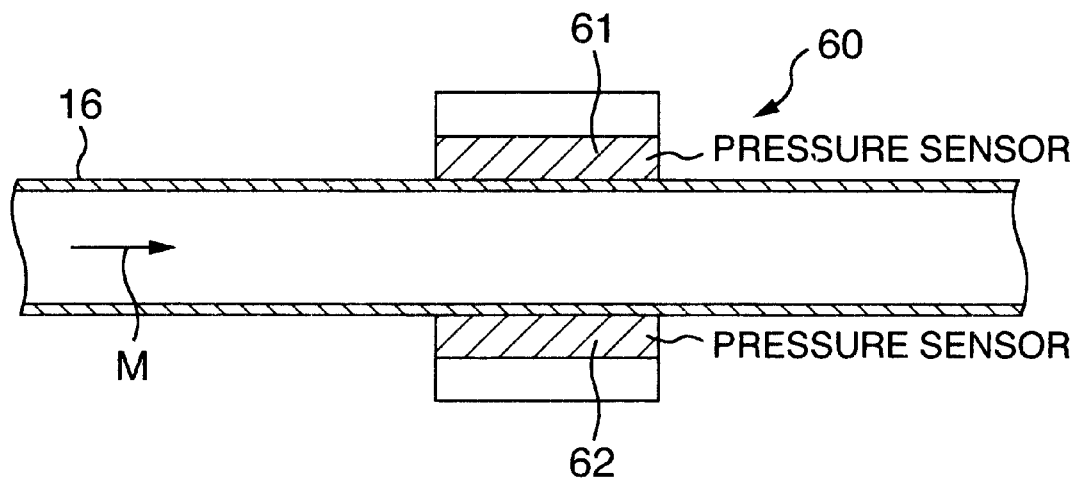
FIGS. 22A and 22B are conceptual views showing a further example of the method for detecting a flow of the cooling liquid.
Figure 22B:
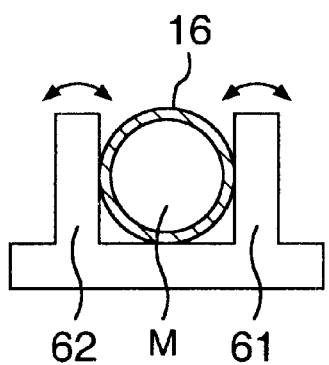

FIGS. 22A and 22B are sectional views showing a further embodiment of the method for detecting a freeze of the cooling liquid. Other than the method for measuring temperatures by the thermal sensors S1 to S5 as described in the aforementioned embodiments, another method for making a judgment as to whether the thermal medium M in the tube 16 is frozen or not, will be illustrated in this embodiment.

That is, in this embodiment, there is shown an example in which a freeze detecting device 60 made of a pair of pressure sensors 61 and 62 disposed on a part of the tube 16 is used to detect a change of the diameter of the tube 16.

When the thermal medium M in the tube 16 is frozen, the volume of the thermal medium M changes. As a result, the diameter of the tube 16 changes. The change of the diameter of the tube 16 is detected by the pair of pressure sensors 61 and 62 to thereby detect a freeze of the thermal medium M.

Figure 23:
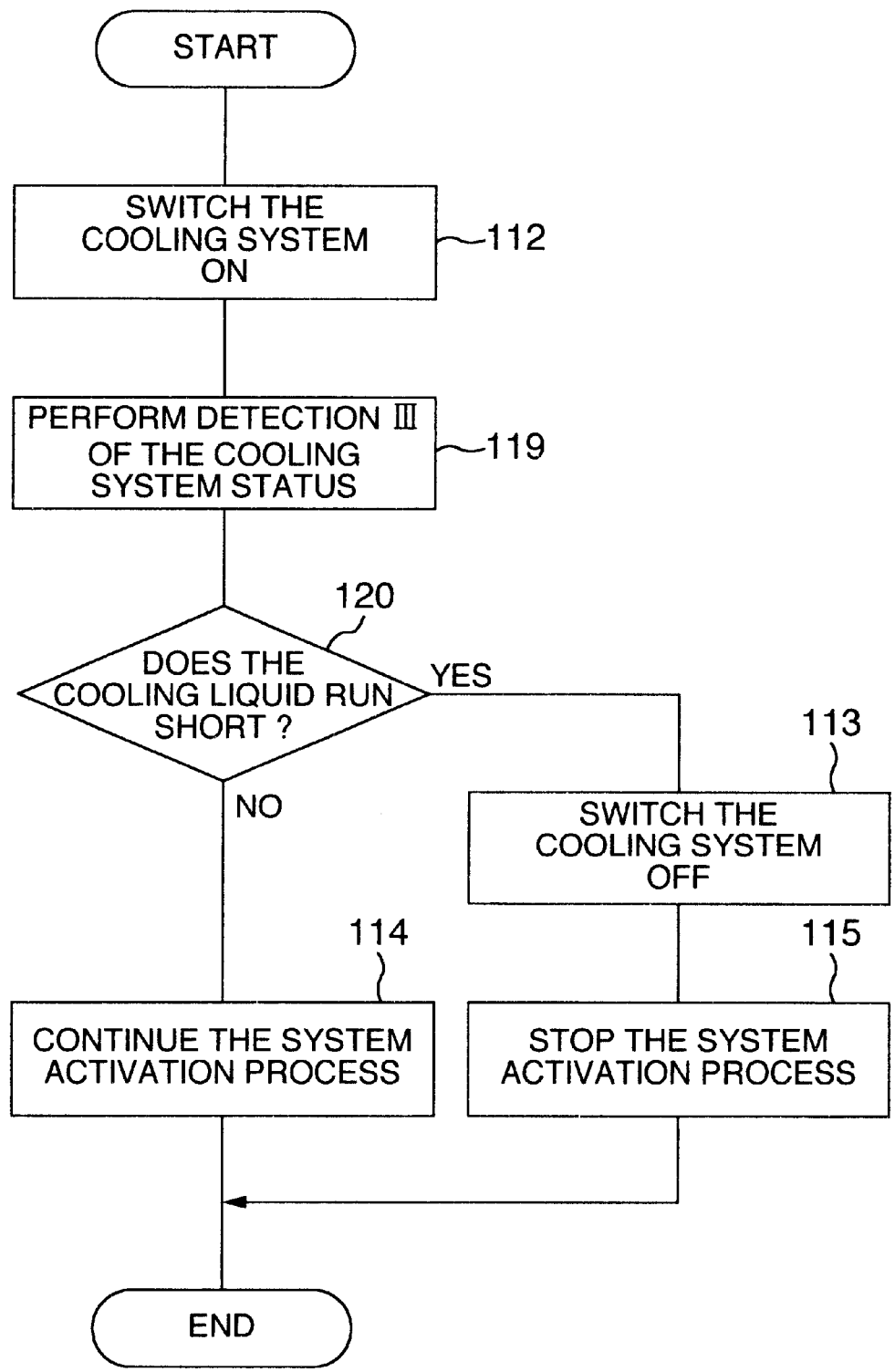
FIG. 23 is a flow chart showing a further example of the method for checking shortage of the cooling liquid.

FIG. 23 is a flow chart showing an example of the operation of a further embodiment in the case where the cooling liquid runs short.

In this embodiment, when the information processing apparatus 20 is to be activated, the cooling system 10 is activated (step 112). The detection III of the cooling system status is executed for detecting shortage of the thermal medium M (cooling liquid) in the cooling system 10 (step 119). A judgment is made as to whether shortage of the thermal medium M occurs or not (step 120). When the thermal medium M runs short, the cooling system 10 is regarded as abnormal and stopped (step 113) and, at the same time, the activation process (bootstrap, etc.) of the information processing apparatus 20 is also stopped (step 115). When the thermal medium M does not run short, the cooling system 10 is regarded as normal and the activation (bootstrap, etc.) of the information processing apparatus 20 is continued (step 114).

Figure 24:
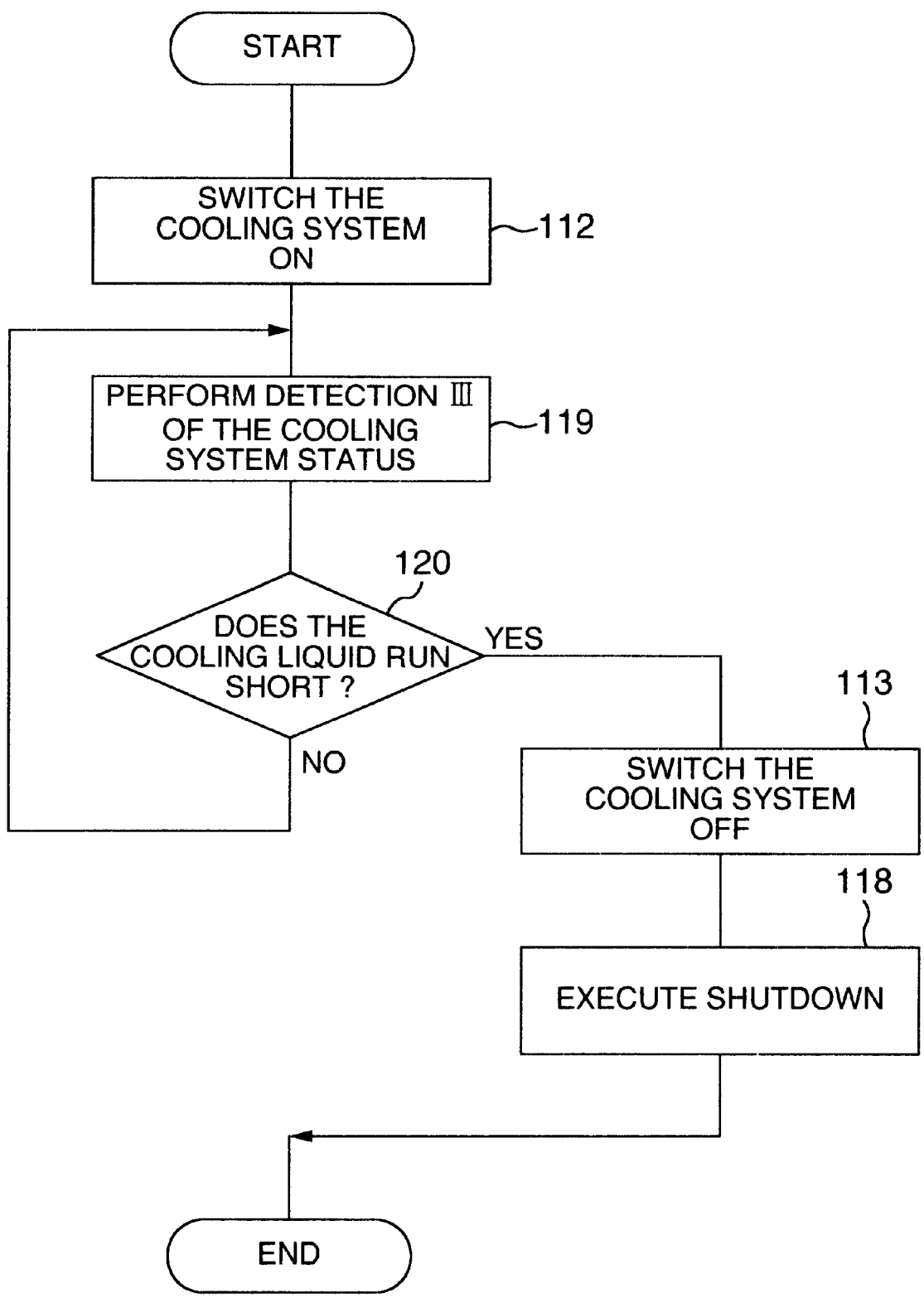
FIG. 24 is a flow chart showing a further example of the method for checking shortage of the cooling liquid.

Alternatively, as illustrated in the flow chart of FIG. 24, the detection of shortage of the thermal medium M may be executed when the information processing apparatus 20 is in operation.

That is, after the information processing apparatus 20 and the cooling system 10 are activated (step 112), the detection III of the cooling system status is executed while the information processing apparatus 20 and the cooling system 10 are in a normal operating state (step 119). The process of making a judgment as to whether shortage of the thermal medium M (cooling liquid) occurs or not (step 120) is performed continuously. When detection is made that the thermal medium M is not circulated, the cooling system 10 is regarded as abnormal and the cooling system 10 is stopped (step 113) and, at the same time, a shutdown process for stopping the operation of the information processing apparatus 20 is executed (step 118).

An example of the method for detecting a flow of the thermal medium M (cooling liquid) in the step 116 in FIGS. 23 and 24 will be illustrated below.

Figure 25:
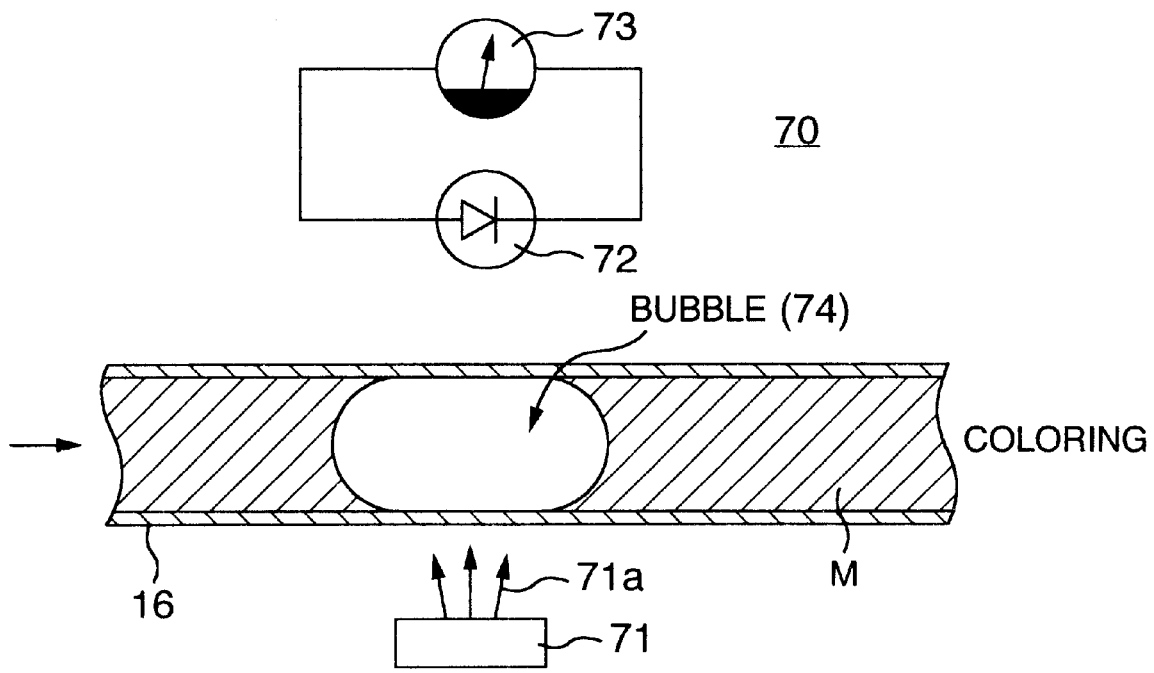
FIG. 25 is a flow chart showing a further example of the method for checking shortage of the cooling liquid.

FIG. 25 is a conceptual view showing an example of the configuration of a liquid-shortage-detecting device 70 for detecting shortage of the thermal medium M in this embodiment.

The liquid-shortage-detecting device 70 is constituted by a light source 71, a photo sensor 72 and a voltmeter 73. The light source 71 and the photo sensor 72 are disposed so as to be opposite to each other with respect to the tube 16, and the voltmeter 73 is disposed to measure a voltage generated in the photo sensor 72 in accordance with the quantity of inspection light 71a incident onto the photo sensor 72 from the light source 71 via the tube 16 (and the thermal medium M flowing in the tube 16). In this case, a material for the tube 16 needs to have transparency by a certain degree or higher with respect to the inspection light 71a.

When the thermal medium M runs short because of leaking or insufficient supplement of the thermal medium M, etc., a bubble 74 is mixed in the thermal medium M as shown in FIG. 25. Hence, when the inspection light 71a passes through the bubble, the transmission factor of the inspection light 71a increases so that the quantity of the inspection light 71a detected by the photo sensor 72 increases temporarily. Accordingly, when, for example, the change of the quantity of the inspection light 71a which is converted into a voltage in the voltmeter 73 is integrated in the direction of the time axis for each circulation cycle of the thermal medium M in the tube 16, and if the integrated value exceeds a predetermined threshold, shortage of the thermal medium M can be judged. In this case, as occasion demands, the thermal medium M may be colored to increase the difference between the transmission factor of the inspection light 71a to the thermal medium M and the transmission factor of the inspection light 71a to the bubble 74 so that the detection sensitivity can be increased.

Figure 26:
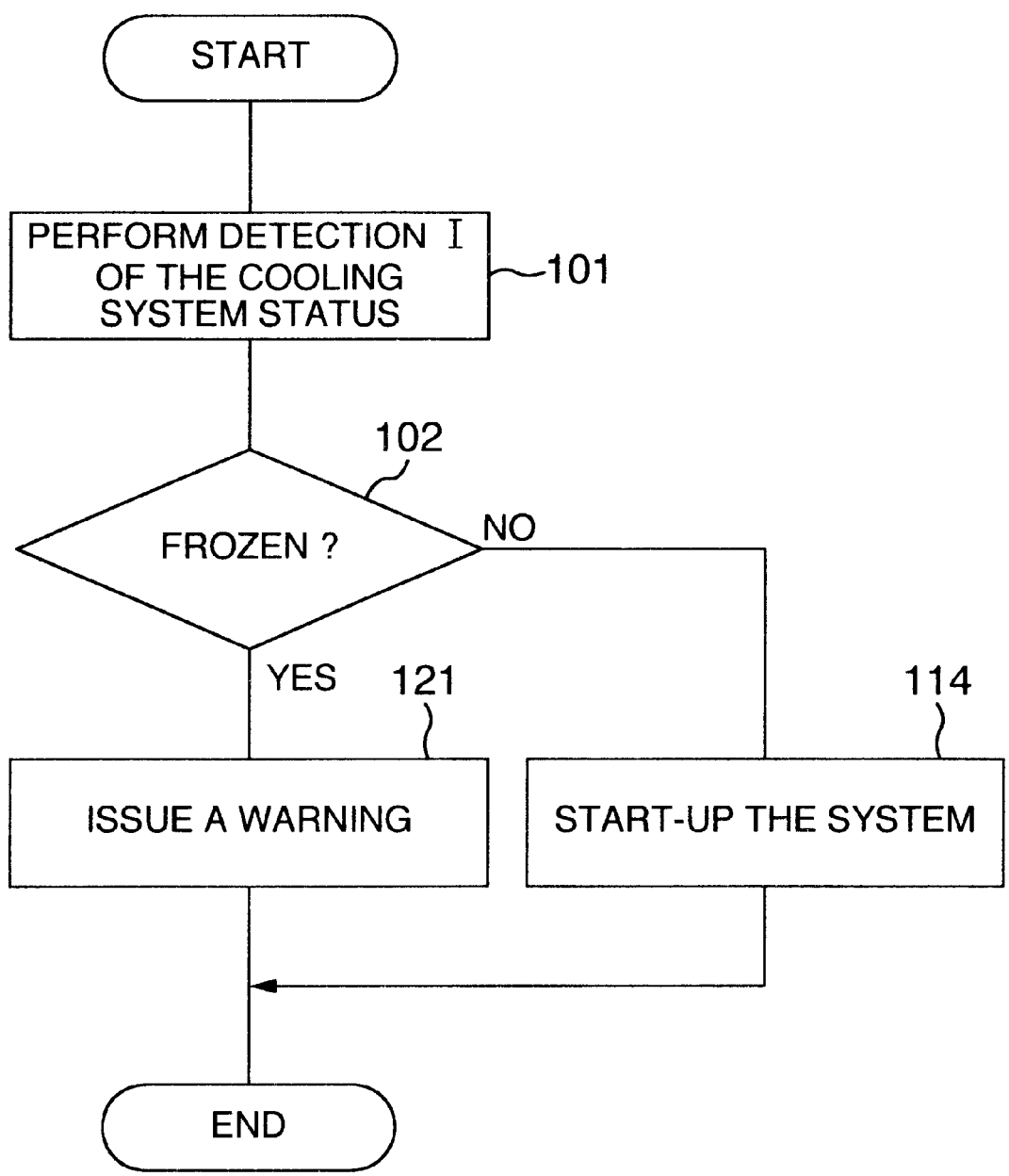
FIG. 26 is a flow chart showing an example in which a warning is issued in the frozen-state process.

FIG. 26 is a flow chart showing an example of an embodiment of the system operation in the case where a freeze of the cooling liquid is detected.

In this embodiment, when the information processing apparatus 20 is to be activated, the detection I of the cooling system status illustrated in FIG. 2 is executed (step 101). When a freeze of the thermal medium M in the cooling system 10 is detected, a warning portion 17 provided in the cooling system 10 is used for issuing a warning to the user of the information processing apparatus 20 (step 121). The warning portion 17 is provided in the cooling system 10 so as to be independent of an alarm system provided in the information processing apparatus 20. Hence, the aforementioned warning can be issued regardless of the activation of the information processing apparatus 20.

Though not shown specifically, in the step 121, the starting-up process of the information processing apparatus 20 may be stopped, or the defrosting process may be executed by the heater 18 as described above, or the defrost process may be executed by shifting the CPU state into a CPU throttling state as described above, after a warning has been issued.

When a judgment is made that the thermal medium M is not frozen in the step 102, the ordinary system starting-up process is executed (step 114).

FIG. 27 is a conceptual view showing an example of the configuration of the information processing apparatus for carrying out the present invention. The aforementioned embodiments have illustrated the case where the control portion 11 of the cooling system 10 operates autonomically to perform various kinds of controlling operations independent of the information processing apparatus 20. In this embodiment, description is made about the case where the CPU 81 of the information processing apparatus 80 itself makes an operation of controlling the cooling system 10A.

In FIG. 27, the reference numeral 81 designates a CPU; 82, a CPU bus; 83, a bus controller; 84, a main memory; 85, an indicating portion; 86, a system bus; and 87, a clock generating control portion.

The CPU 81 such as a microprocessor operates to make access to not-shown programs and not-shown data which are stored in the main memory 84 through the CPU bus 82 and the bus controller 83. Hence, the CPU 81 sends out necessary information as visual data to the indicating portion 85 such as a display.

The clock generating control portion 87 supplies an operating clock to the CPU 81. The clock generating control portion 87 can make the CPU 81 operate with an ordinary rating frequency, or make the CPU 81 operate in a CPU throttling state with an operating frequency lower than the rating frequency.

In this embodiment, the cooling system 10A is provided as one of peripheral devices connected to the system bus 86 such as a general-purpose bus to which the peripheral devices or the like not shown are connected.

The configuration of the cooling system 10A is substantially the same as that illustrated in FIG. 3, except that the control portion 11A transmits information received from various kinds of sensors to the CPU 81 of the information processing apparatus 80 through the system bus 86 and except that (software such as operating system, BIOS, or the like, of) the CPU 81 issues a command to the control portion 11A so as to perform an operation of controlling respective portions of the cooling system 10A. For example, the controlling operation illustrated in FIG. 1 is carried out in this embodiment in the following manner. The control portion 11A transmits temperature measurement results measured by the thermal sensors S1 to S5 to the CPU 81. The CPU 81 then makes a judgment as to whether a freeze occurs in the cooling system 10A or not. For example, the CPU 81 controls the clock generating control portion 87 to reduce the CPU's own operating frequency to shift the CPU state into a CPU throttling state to thereby defrost the thermal medium M on the basis of the heat generated in the CPU 81 itself.

Further, the CPU 81 issues a command to the control portion 11A to operate respective portions such as the control portion 11A, the pump 12, the warning portion 17, the heater 18, or the like, in the cooling system 10A.

This embodiment can be achieved easily if the control portion 11A in the cooling system 10A has a simple register interface for exchanging information between the control portion 11A and the CPU 81 through the system bus 86. Hence, this embodiment has an advantage in that control logic in the control portion 11A, or the like, can be simplified greatly.

What is claimed is:

1. A method of cooling a heat generating portion by circulating a cooling liquid between a heat-absorbing portion and a heat-radiating portion to thereby cool a heat-generating portion including at least a CPU, said heat-absorbing portion being mounted on said heat-generating portion, comprising the steps of:

(a) making detection as to whether said cooling liquid is frozen or not; and (b) performing a frozen-state process for said personal computer when a freeze of said cooling liquid is detected, wherein the step (b) includes at least one of the steps of:

requesting said CPU to throttle down or to reduce an operating frequency of said CPU to reduce a processing capacity of said CPU to an operable level without circulation of said cooling liquid to thereby defrost said cooling liquid by heat generated in said CPU;

indicating a warning of a freeze of said cooling liquid; and stopping the operation of said personal computer.

2. A method according to claim 1, wherein:

in the step (a), said detection as to whether said cooling liquid is frozen or not is made when a system of said personal computer is activated; and in the step (b), said frozen-state process for said personal computer is performed when a freeze of said cooling liquid is detected in the step (a).

3. A method according to claim 1, wherein:

in the step (a), said detection as to whether said cooling liquid is frozen or not is made at a point of time set in advance in a timer function contained in said personal computer; and in the step (b), said frozen-state process for said personal computer is performed when a freeze of said cooling liquid is detected in the step (a).

4. A method of cooling a heat generating portion by circulating a cooling liquid between a heat-absorbing portion and a heat-radiating portion to thereby cool a heat-generating portion including at least a CPU, said heat-absorbing portion being mounted on said heat-generating portion, comprising the steps of:

(a) making detection as to whether said cooling liquid is frozen or not; and (b) performing a frozen-state process for said personal computer when a freeze of said cooling liquid is detected, wherein said detection in the step (a) as to whether said cooling liquid is frozen or not, is based on any one of the steps of:

making detection as to whether said cooling liquid is circulated or not;

detecting a temperature of a circulation path to compare the detected value of said temperature with a predetermined value to thereby judge a freeze of said cooling liquid; and measuring a quantity of deformation of said circulation path to compare the measured value of said deformation quantity with a predetermined value to thereby judge a freeze of said cooling liquid.

5. A method according to claim 4, wherein:

in the step (a), said detection as to whether said cooling liquid is frozen or not is made when a system of said personal computer is activated; and in the step (b), said frozen-state process for said personal computer is performed when a freeze of said cooling liquid is detected in the step (a).

6. A method according to claim 4, wherein:
in the step (a), said detection as to whether said cooling liquid is frozen or not is made at a point of time set in advance in a timer function contained in said personal computer; and
in the step (b), said frozen-state process for said personal computer is performed when a freeze of said cooling liquid is detected in the step (a).

7. A method of cooling a heat generating portion by circulating a cooling liquid between a heat-absorbing portion and a heat-radiating portion to thereby cool a heat-generating portion including at least a CPU, said heat-absorbing portion being mounted on said heat-generating portion, comprising the steps of:
(a) periodically detecting a temperature of said cooling liquid or a temperature of a circulation path equivalent to said temperature of said cooling liquid; and
(b) performing a process of preventing said cooling liquid from being frozen when the detected temperature is lower than a predetermined temperature.

8. A method according to claim 7, wherein said freeze-preventing process in the step (b) is performed by either one of the methods of:
forcedly circulating said cooling liquid; and
heating said cooling liquid.

9. A method according to claim 8, wherein the methods of heating said cooling liquid include operating said CPU to heat said cooling liquid by heat generated in said CPU.

10. A personal computer having a cooling liquid circulated between a heat-absorbing portion and a heat-radiating portion to thereby cool a heat-generating portion including at least a CPU, said heat-absorbing portion being mounted on said heat-generating portion, comprising:
a freeze-detecting portion for making detection as to whether said cooling liquid is frozen or not; and
a control portion for performing a frozen-state process of said cooling liquid when a freeze of said cooling liquid is detected by said freeze-detecting portion, wherein:
said CPU includes a CPU throttling control portion; and
said control portion for performing said frozen-state process requests said CPU throttling control portion to throttle down said CPU to reduce the processing capacity of said CPU to an operable level even without circulating said cooling liquid to thereby defrost said cooling liquid by heat generated in said CPU.

11. A personal computer according to claim 10, wherein:
said personal computer further comprises a timer portion for making a request to detect a freeze of said cooling liquid at a set point of time; and
said control portion for performing said frozen-state process detects a freeze of said cooling liquid in accordance with said request of said timer portion to thereby defrost said cooling liquid when said cooling liquid is frozen.

12. A personal computer having a cooling liquid circulated between a heat-absorbing portion and a heat-radiating portion to thereby cool a heat-generating portion including at least a CPU, said heat-absorbing portion being mounted on said heat-generating portion, comprising:
a freeze-detecting portion for making detection as to whether said cooling liquid is frozen or not; and
a control portion for performing a frozen-state process of said cooling liquid when a freeze of said cooling liquid is detected by said freeze-detecting portion, wherein:
said freeze-detecting portion includes a temperature measuring portion for measuring a temperature of a circulation path of said cooling liquid, and a freeze-judging portion for judging a frozen state of said cooling liquid on the basis of comparison between the measured value of said temperature and a predetermined value; and
said control portion for performing said frozen-state process defrosts said cooling liquid when a freeze of said cooling liquid is detected by said freeze-detecting portion.

13. A personal computer according to claim 12, wherein said temperature measuring portion for measuring the temperature of the circulation path of said cooling liquid measures a temperature of a hinge portion which passes said circulation path of said cooling liquid and by which a display unit of said personal computer and a body unit, inclusive of said CPU, of said personal computer are connected to each other so that said display unit can rotate relative to said body unit.

14. A personal computer having a cooling liquid circulated between a heat-absorbing portion and a heat-radiating portion to thereby cool a heat-generating portion including at least a CPU, said heat-absorbing portion being mounted on said heat-generating portion, comprising:
a freeze-detecting portion for making detection as to whether said cooling liquid is frozen or not; and a control portion for performing a frozen-state process of said cooling liquid when a freeze of said cooling liquid is detected by said freeze-detecting portion, wherein:
said freeze-detecting portion includes a temperature measuring portion for measuring a quantity of deformation of a circulation path of said cooling liquid, and a freeze-judging portion for judging a frozen state of said cooling liquid on the basis of comparison between the measured value of said deformation quantity and a predetermined value; and
said control portion for performing said frozen-state process defrosts said cooling liquid when a freeze of said cooling liquid is detected by said freeze-detecting portion.

15. A personal computer having a cooling liquid circulated between a heat-absorbing portion and a heat-radiating portion to thereby cool a heat-generating portion including at least a CPU, said heat-absorbing portion being mounted on said heat-generating portion, comprising:
a temperature-measuring portion for measuring a temperature of a circulation path of said cooling liquid periodically; and
a freeze-preventing portion for performing a process of preventing said cooling liquid from being frozen when the detected temperature is lower than a predetermined temperature.

16. A personal computer according to claim 15, wherein said freeze-preventing portion circulates said cooling liquid between said heat-absorbing portion and said heat-radiating portion to thereby prevent said cooling liquid from being frozen.

17. A personal computer according to claim 15, wherein:
said freeze-preventing portion includes a heating portion for heating said circulation path; and said cooling liquid is heated by said heating portion when the value of the temperature detected by said temperature-measuring portion is lower than said predetermined temperature.

18. A personal computer according to claim 17, wherein:

said CPU includes a CPU throttling control portion; and said heating portion requests said CPU throttling control portion to throttle down said CPU to make said CPU operate with low heat generation to thereby heat said cooling liquid by the heat generated in said CPU.

* * * * *